(12) United States Patent
Lee

(10) Patent No.: US 12,354,690 B2
(45) Date of Patent: Jul. 8, 2025

(54) SEMICONDUCTOR DEVICE AND METHOD OF TESTING THE SEMICONDUCTOR DEVICE

(71) Applicant: SK hynix Inc., Icheon-si (KR)

(72) Inventor: Jun Hyuk Lee, Icheon-si (KR)

(73) Assignee: SK hynix Inc., Icheon-si (KR)

(*) Notice: Subject to any disclaimer, the term of this patent is extended or adjusted under 35 U.S.C. 154(b) by 179 days.

(21) Appl. No.: 18/320,088

(22) Filed: May 18, 2023

(65) Prior Publication Data

US 2024/0177791 A1 May 30, 2024

(30) Foreign Application Priority Data

Nov. 25, 2022 (KR) .................. 10-2022-0159853

(51) Int. Cl.
*G11C 29/12* (2006.01)
*G11C 29/18* (2006.01)
*G11C 29/44* (2006.01)

(52) U.S. Cl.
CPC .......... *G11C 29/44* (2013.01); *G11C 29/1201* (2013.01); *G11C 29/18* (2013.01); *G11C 2029/1802* (2013.01)

(58) Field of Classification Search
CPC .... G11C 2029/1202; G11C 2029/1802; G11C 29/025; G11C 29/1201; G11C 29/18; G11C 29/44

USPC .......................................................... 365/201
See application file for complete search history.

(56) References Cited

U.S. PATENT DOCUMENTS

| | | | |
|---|---|---|---|
| 11,393,533 B1* | 7/2022 | Zhan ................. | G11C 16/26 |
| 2016/0240232 A1* | 8/2016 | Lee .................. | G11C 29/52 |
| 2016/0247578 A1* | 8/2016 | Yun .................. | G11C 16/3418 |
| 2017/0062061 A1* | 3/2017 | Nakajima ........... | G11C 16/26 |
| 2021/0020254 A1* | 1/2021 | Kim .................. | G11C 16/26 |
| 2021/0020256 A1* | 1/2021 | Kim .................. | G11C 16/26 |
| 2022/0336040 A1* | 10/2022 | Lee .................. | G11C 16/24 |
| 2024/0036753 A1* | 2/2024 | Chin ................. | G06F 3/0653 |

FOREIGN PATENT DOCUMENTS

| KR | 1020150116351 A | 10/2015 |
|---|---|---|
| KR | 1020160116904 A | 10/2016 |

* cited by examiner

*Primary Examiner* — Ly D Pham
(74) *Attorney, Agent, or Firm* — WILLIAM PARK & ASSOCIATES LTD.

(57) ABSTRACT

Provided herein is a semiconductor device and a method of testing the semiconductor device. The method of operating a semiconductor device includes initializing a latch included in a page buffer, applying a read pass voltage to a plurality of word lines, allowing at least one of the plurality of word lines to float, and performing a sensing operation on the page buffer.

14 Claims, 17 Drawing Sheets

SEMICONDUCTOR DEVICE AND METHOD OF TESTING THE SEMICONDUCTOR DEVICE

CROSS-REFERENCE TO RELATED APPLICATION

The present application claims priority under 35 U.S.C. § 119(a) to Korean patent application number 10-2022-0159853 filed on Nov. 25, 2022, in the Korean Intellectual Property Office, the entire disclosure of which is incorporated by reference herein.

BACKGROUND

1. Technical Field

Various embodiments of the present disclosure relate to an electronic device, and more particularly to a semiconductor device and a method of testing the semiconductor device.

2. Related Art

A semiconductor memory device may have a two-dimensional (2D) structure in which strings are horizontally arranged on a semiconductor substrate. Alternatively, the semiconductor memory device may have a three-dimensional (3D) structure in which strings are vertically stacked on a semiconductor substrate. As a memory device having a 2D structure is reaching its physical scaling limit (i.e., limit in the degree of integration), a 3D memory device including a plurality of memory cells vertically stacked on a semiconductor substrate has been produced.

As the degree of integration of semiconductor memory devices increases, the structures of a memory cell array and conductive lines coupled thereto are reduced to have a micro-size and micro-patterns. Accordingly, during a manufacturing process for semiconductor memory devices or during the operation of semiconductor memory devices, faults or defects in the memory cell array and conductive lines coupled thereto may occur. In particular, a short-circuit fault in which a word line or a select line coupled to the memory cell array is shorted to another component may occur.

SUMMARY

An embodiment of the present disclosure may provide for a method of operating a semiconductor device. The method may include initializing a latch included in a page buffer, applying a read pass voltage to a plurality of word lines, allowing at least one of the plurality of word lines to float, and performing a sensing operation on the page buffer.

An embodiment of the present disclosure may provide for a method of operating a semiconductor device. The method may include initializing a latch included in a page buffer, applying a turn-on voltage to at least one of a plurality of select lines coupled to a memory block, applying a read pass voltage to a plurality of word lines, allowing the at least one select line to float, and performing a sensing operation on the page buffer.

An embodiment of the present disclosure may provide for a semiconductor device. The semiconductor device may include a memory cell array including a plurality of memory cells, a page buffer coupled to the memory cell array through a bit line, an address decoder coupled to the memory cell array through select lines and word lines, and control logic configured to control operations of the page buffer and the address decoder, wherein the control logic is configured to control the page buffer and the address decoder to initialize a latch included in the page buffer, apply a read pass voltage to the word lines, allow at least one of the word lines and the select lines to float, and perform a sensing operation on the page buffer.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a semiconductor memory device that is capable of detecting short-circuit faults occurring in a word line or a select line, and a method of testing the semiconductor memory device.

Figure 1:
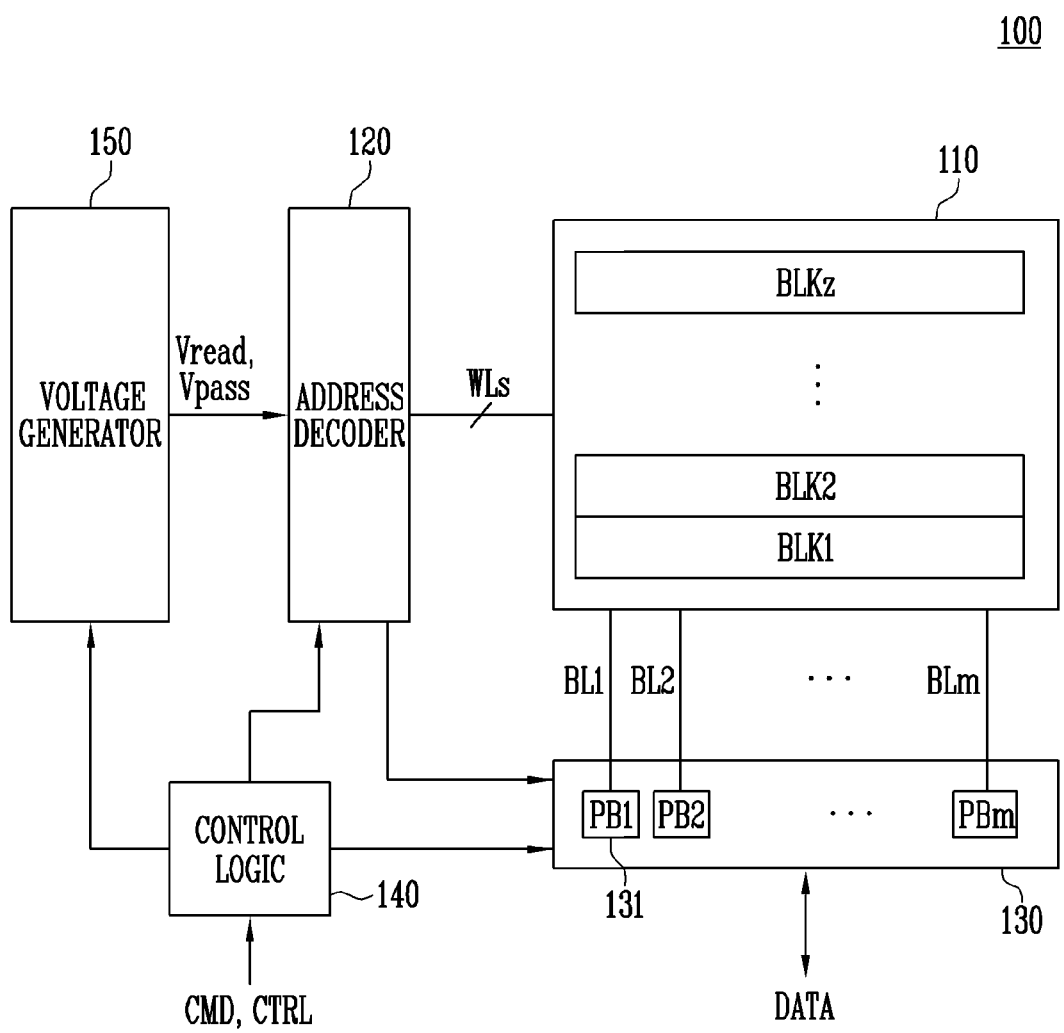
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 may include a memory cell array 110, an address decoder 120, a read and write circuit 130, control logic 140, and a voltage generator 150. The control logic 140 may be implemented as hardware, software, or a combination of hardware and software. For example, the control logic 140 may be a control logic circuit operating in accordance with an algorithm and/or a processor executing control logic code.

The memory cell array 110 may include a plurality of memory blocks BLK1 to BLKz. The memory blocks BLK1 to BLKz are coupled to the address decoder 120 through word lines WLs. The memory blocks BLK1 to BLKz are coupled to the read and write circuit 130 through bit lines BL1 to BLm. Each of the memory blocks BLK1 to BLKz includes a plurality of memory cells. In an embodiment, the plurality of memory cells may be nonvolatile memory cells, and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Meanwhile, each of the memory cells included in the memory cell array may store at least one bit of data. In an embodiment, each of the memory cells included in the memory cell array 110 may be a single-level cell (SLC), which stores one bit of data. In an embodiment, each of the memory cells included in the memory cell array 110 may be a multi-level cell (MLC), which stores 2 bits of data. In accordance with an embodiment, the memory cell array 110 may include a plurality of memory cells, each of which stores three or more bits of data.

The address decoder 120, the read and write circuit 130, and the voltage generator 150 are operated as a peripheral circuit for driving the memory cell array 110. The peripheral circuit may perform a read operation, a write operation, and an erase operation on the memory cell array 110 under the control of the control logic 140. The address decoder 120 may be coupled to the memory cell array 110 through the word lines WLs. The address decoder 120 may be operated under the control of the control logic 140. The address decoder 120 receives addresses through an input/output buffer (not illustrated) provided in the semiconductor memory device 100.

The address decoder 120 may decode the block address, among the received addresses. The address decoder 120 selects at least one memory block according to the decoded block address. When a read voltage apply operation is performed during a read operation, the address decoder 120 may apply a read voltage Vread, generated by the voltage generator 150, to a selected word line of the selected memory block, and may apply a pass voltage Vpass to the remaining word lines, that is, unselected word lines. Further, during a program verify operation, the address decoder 120 may apply a verify voltage, generated by the voltage generator 150, to the selected word line of the selected memory block, and may apply the pass voltage Vpass to the remaining word lines, that is, unselected word lines.

The address decoder 120 may decode the column address, among the received addresses. The address decoder 120 may transmit the decoded column address to the read and write circuit 130.

Each of the read and program operations of the semiconductor memory device 100 may be performed on a page basis. Addresses received in response to requests for the read and program operations may include a block address, a row address, and a column address. The address decoder 120 may select one memory block and one word line according to the block address and the row address. The column address may be decoded by the address decoder 120, and may then be provided to the read and write circuit 130.

The address decoder 120 may include a block decoder, a row decoder, a column decoder, an address buffer, etc.

The read and write circuit 130 may include a plurality of page buffers PB1 to PBm including a page buffer PB1 131 coupled to a first bit line. The read and write circuit 130 may be operated as a "read circuit" during a read operation on the memory cell array 110 and as a "write circuit" during a write operation on the memory cell array 110. The plurality of page buffers PB1 to PBm may be coupled to the memory cell array 110 through the bit lines BL1 to BLm. In order to sense the threshold voltages of the memory cells during a read operation and a program verify operation, each of the page buffers PB1 to PBm may sense, through a sensing node, a change in the amount of flowing current depending on the program state of the corresponding memory cell and latch the sensed change as sensing data while continuously supplying a sensing current to the bit lines coupled to the memory cells. The read and write circuit 130 may be operated in response to page buffer control signals output from the control logic 140.

During a read operation, the read and write circuit 130 may sense data stored in the memory cells and temporarily store read data, and may then output data DATA to the input/output buffer (not illustrated) of the semiconductor memory device 100. In an embodiment, the read and write circuit 130 may include a column select circuit or the like in addition to the page buffers (or page registers).

The control logic 140 is coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. Also, the control logic 140 may output a control signal for controlling the precharge potential level of a sensing node in each of the plurality of page buffers PB1 to PBm. The control logic 140 may control the read and write circuit 130 to perform a read operation on the memory cell array 110.

The voltage generator 150 may generate the read voltage Vread and the pass voltage Vpass required for a read operation in response to the control signal output from the control logic 140. The voltage generator 150 may include a plurality of pumping capacitors for receiving the internal supply voltage so as to generate a plurality of voltages having various voltage levels, and may generate a plurality of voltages by selectively enabling the plurality of pumping capacitors under the control of the control logic 140. Meanwhile, the voltage generator 150 may further include a voltage regulator in addition to the plurality of pumping capacitors.

Figure 2:
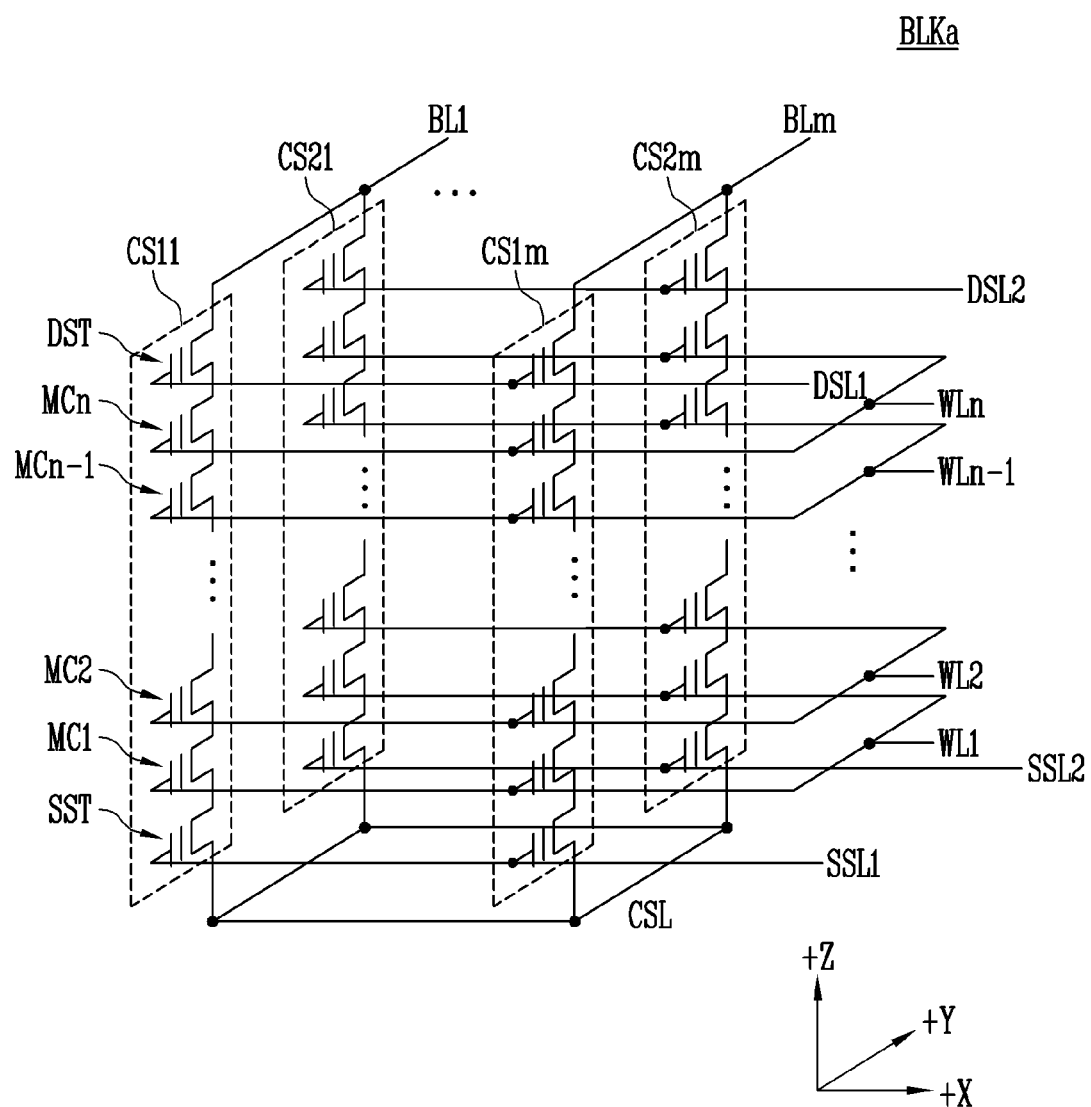
FIG. 2 is a circuit diagram illustrating any one memory block BLKa of memory blocks BLK1 to BLKz of FIG. 1.

FIG. 2 is a circuit diagram illustrating any one memory block BLKa of memory blocks BLK1 to BLKz of FIG. 1.

Referring to FIG. 2, the memory block BLKa may include a plurality of cell strings CS11 to CS1m and CS21 to CS2m. In the memory block BLKa, m cell strings may be arranged in a row direction (i.e., a positive (+) X direction). In FIG. 2, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST in each cell string is coupled between a common source line CSL and the memory cells MC1 to MCn.

In an embodiment, the source select transistors of cell strings arranged in the same row are coupled to a source select line extending in a row direction, and the source select transistors of cell strings arranged in different rows are coupled to different source select lines. In FIG. 2, the source select transistors of the cell strings CS11 to CS1m in a first row are coupled to a first source select line SSL1. The source select transistors of the cell strings CS21 to CS2m in a second row are coupled to a second source select line SSL2.

In an embodiment, the source select transistors of the cell strings CS11 to CS1m and CS21 to CS2m may be coupled in common to one source select line.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn. The cell strings arranged in the row direction are coupled to drain select lines extending in the row direction. The drain select transistors of the cell strings CS11 to CS1m in the first row are coupled to a first drain select line DSL1. The drain select transistors of the cell strings CS21 to CS2m in the second row are coupled to a second drain select line DSL2.

Cell strings arranged in the column direction may be coupled to bit lines extending in the column direction. In FIG. 2, the cell strings CS11 and CS21 in a first column are coupled to a first bit line BL1. The cell strings CS1m and CS2m in an m-th column are coupled to an m-th bit line BLm.

Memory cells coupled to the same word line in cell strings arranged in the row direction form one page. For example, memory cells coupled to the first word line WL1, among the cell strings CS11 to CS1m in the first row, form one page. Memory cells coupled to the first word line WL1, among the cell strings CS21 to CS2m in the second row, form one additional page. Cell strings arranged in the direction of one row may be selected by selecting any one of the drain select lines DSL1 and DSL2. One page may be selected from the selected cell strings by selecting any one of the word lines WL1 to WLn.

In an embodiment, instead of the first to m-th bit lines BL1 to BLm, even bit lines and odd bit lines may be provided. Even-numbered cell strings, among the cell strings CS11 to CS1m or CS21 to CS2m arranged in a row direction, may be coupled to respective even bit lines. Odd-numbered cell strings, among the cell strings CS11 to CS1m or CS21 to CS2m arranged in the row direction, may be coupled to respective odd bit lines.

In an embodiment, one or more of first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As the number of dummy memory cells that are provided is increased, in an embodiment, the reliability of operation of the memory block BLKa may be improved, whereas the size of the memory block BLKa may be increased. As the number of dummy memory cells that are provided is decreased, in an embodiment, the size of the memory block BLKa may be decreased, whereas the reliability of operation of the memory block BLKa may be deteriorated.

In order to efficiently control the one or more dummy memory cells, respective dummy memory cells may have required threshold voltages. Before or after an erase operation on the memory block BLKa is performed, program operations may be performed on all or some of the dummy memory cells.

Although the memory block BLKa illustrated in FIG. 2 has a three-dimensional (3D) structure, the present disclosure is not limited thereto. For example, the memory cell array of the semiconductor memory device according to the present disclosure may include a memory block having a 2D structure.

Meanwhile, although the memory block BLKa illustrated in FIG. 2 is illustrated as being a 2-string structure in which two cell strings are coupled to one bit line, the present disclosure is not limited thereto. In an example, in the memory block included in the semiconductor memory device according to the present disclosure, three or four cell strings may be coupled to one bit line. In an example, in the memory block included in the semiconductor memory device according to the present disclosure, five or more cell strings may be coupled to one bit line.

As the degree of integration of a semiconductor memory device increases, the structures of memory cells included in the memory block BLKa and conductive lines coupled thereto are miniaturized and refined. Accordingly, during a manufacturing process for semiconductor memory devices or during the operation of semiconductor memory devices, faults or defects in the memory cell array and conductive lines coupled thereto may occur. In particular, faults in which word lines WL1 to WLn or select lines DSL1, DSL2, SSL1, and SSL2 coupled to the memory cell array are shorted to other components may occur. For example, short-circuits attributable to impurities, gas or the like may occur between word lines and channels of memory cells during a manufacturing process.

In accordance with the present disclosure, at least one of the word lines WL1 to WLn and the select lines DSL1, DSL2, SSL1, and SSL2 coupled to the memory block BLKa may be precharged, and thereafter may float. Thereafter, whether short-circuit faults have occurred in the word lines WL1 to WLn and the select lines DSL1, DSL2, SSL1, and SSL2 may be detected by performing a read operation on the memory block BLKa.

Figure 3:
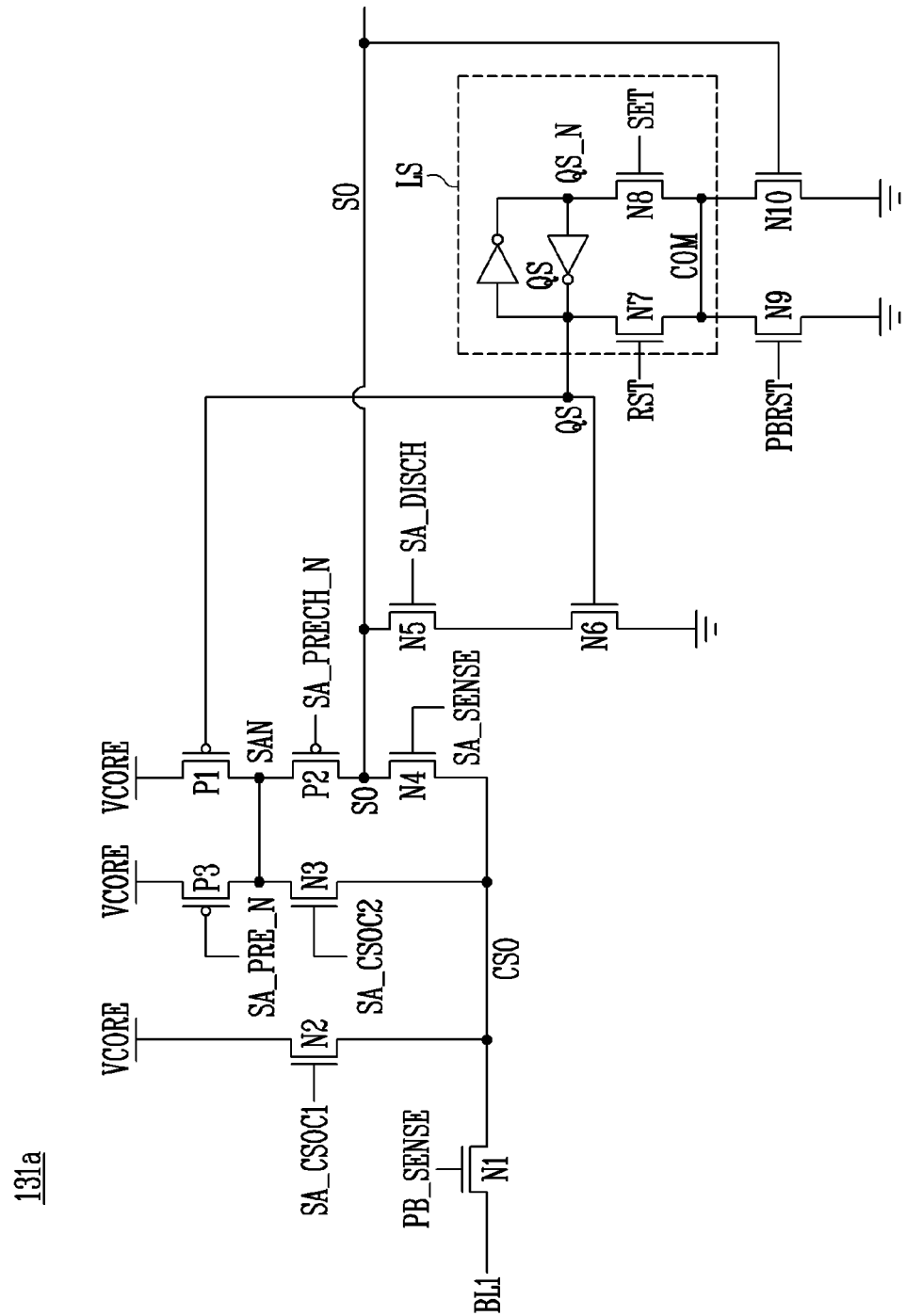
FIG. 3 is a circuit diagram illustrating an embodiment of a page buffer.

FIG. 3 is a circuit diagram illustrating an embodiment of a page buffer. In detail, a page buffer 131a illustrated in FIG. 3 is an embodiment of the page buffer 131 illustrated in FIG. 1.

The page buffer 131a may be operated in response to a signal output from control logic 140. Signals PB_SENSE, SA_CSOC1, SA_CSOC2, SA_PRE_N, SA_PRECH_N, SA_SENSE, SA_DISCH, RST, SET, and PBRST, which will be described later, may be control signals output from the control logic 140. The page buffer 131a will be described in detail below.

Referring to FIG. 3, the page buffer 131a may be coupled to a memory cell through a bit line BL1. Also, the page buffer 131a may include first to sixth NMOS transistors N1 to N6 and first to third PMOS transistors P1 to P3. Further, the page buffer 131a may include a latch circuit LS. The latch circuit LS may include latches coupled between nodes QS and QS_N, a seventh NMOS transistor N7 coupled between the node QS and a node COM, and an eighth NMOS transistor N8 coupled between the node QS_N and the node COM. The voltage value of the node QS of the latch circuit LS and the voltage value of the node QS_N of the latch circuit LS may be values which are logically inverted with respect to each other. That is, when the voltage value of the node QS is a logic high voltage value, the voltage value of the node QS_N may be a logic low voltage value. On the other hand, when the voltage value of the node QS is a logic low voltage value, the voltage value of the node QS_N may be a logic high voltage value.

The first NMOS transistor N1 is coupled between the bit line BL1 and a node CSO and is controlled in response to the signal PB_SENSE. The second NMOS transistor N2 is coupled between a source of a supply voltage VCORE and the node CSO and is controlled in response to the signal SA_CSOC1. The third PMOS transistor P3 and the third NMOS transistor N3 are coupled in series to each other between the source of the supply voltage VCORE and the node CSO and are controlled in response to the signals SA_PRE_N and SA_CSOC2, respectively. The first and second PMOS transistors P1 and P2 are coupled between the source of the supply voltage VCORE and the node SO, and are controlled in response to the voltage of the node QS and the signal SA_PRECH_N, respectively. The third PMOS transistor P3, the third NMOS transistor N3, the first PMOS transistor P1, and the second PMOS transistor P2 may be coupled to each other through a node SAN. The fourth NMOS transistor N4 is coupled between the node SO and the node CSO and is controlled in response to the signal SA_SENSE.

The fifth and sixth NMOS transistors N5 and N6 are coupled between the node SO and a ground and are controlled in response to the signal SA_DISCH and the voltage of the node QS, respectively.

Meanwhile, the seventh NMOS transistor N7 is coupled between the node QS and the node COM and is controlled in response to the signal RST. The eighth NMOS transistor N8 is coupled between the node QS_N and the node COM and is controlled in response to the signal SET. The ninth NMOS transistor N9 and the tenth NMOS transistor N10 are coupled in parallel to each other between the node COM and the ground and are controlled in response to the signal PBRST and the voltage of the node SO, respectively.

Meanwhile, the page buffer 131a of FIG. 3 is illustrated as including one latch circuit LS. However, as needed, the page buffer may include various numbers of latch circuits. For example, the page buffer may include two or more latch circuits.

Figure 4:
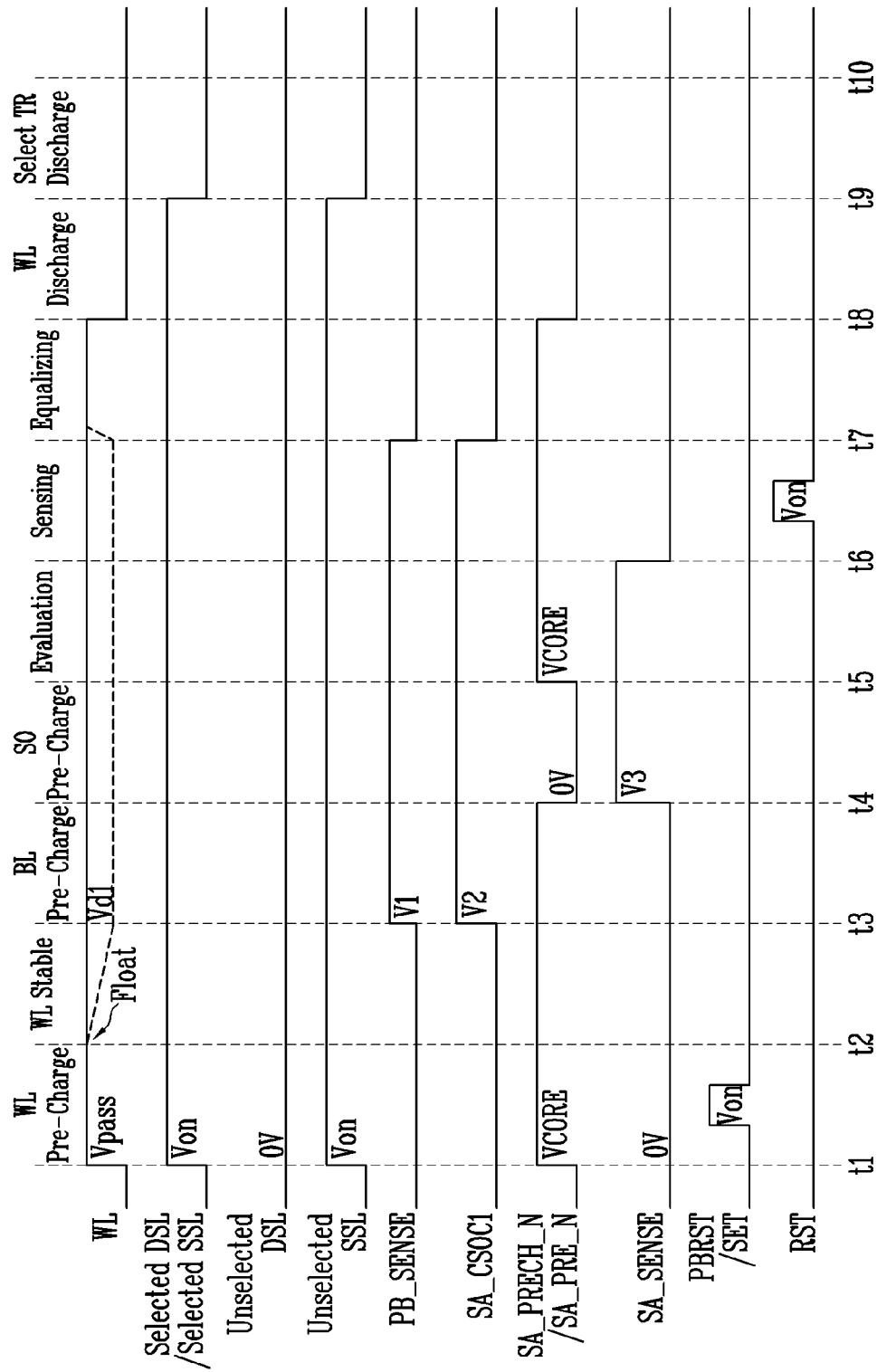
FIG. 4 is a timing diagram for explaining a method of testing a semiconductor memory device according to an embodiment of the present disclosure.

FIG. 4 is a timing diagram for explaining a method of testing a semiconductor memory device according to an embodiment of the present disclosure.

Referring to FIG. 4, the method of testing the semiconductor memory device according to an embodiment of the present disclosure may be configured to apply a read operation that is an operation of reading data stored in each memory cell. In detail, in accordance with the method of testing the semiconductor memory device according to an embodiment of the present disclosure, word lines coupled to a memory block may be precharged, and thereafter the word lines may float. Thereafter, whether short-circuit faults have occurred in word lines may be determined through an evaluation and sensing process after undergoing a bit line precharge and sensing node (SO) precharge operation. In the timing diagram of FIG. 4, the voltage levels of the signals SA_CSOC1, PB_SENSE, SA_PRECH_N, SA_PRE_N, SA_SENSE, PBRST, SET, and RST which are applied to a word line WL, a selected drain select line Selected DSL, a selected source select line Selected SSL, an unselected drain select line Unselected DSL, an unselected source select line Unselected SSL, and signals applied to transistors in a page buffer are illustrated.

Referring to FIG. 4, a word line precharge operation may be performed during a period from t1 to t2, a word line stabilization operation may be performed during a period from t2 to t3, a bit line precharge operation may be performed during a period from t3 to t4, a sensing node (SO) precharge operation may be performed during a period from t4 to t5, an evaluation operation may be performed during a period from t5 to t6, and a sensing operation may be performed during a period from t6 to t7. During a period from t1 to t7, whether short-circuit faults have occurred in word lines may be determined. Additionally, an equalizing operation may be performed during a period from t7 to t8, a word line discharge operation may be performed during a period from t8 to t9, and a select transistor discharge operation may be performed during a period from t9 to t10.

Hereinafter, the method of testing the semiconductor memory device according to an embodiment of the present disclosure will be described in detail with reference to FIGS. 5A to 5F together with FIG. 4.

Figure 5A:
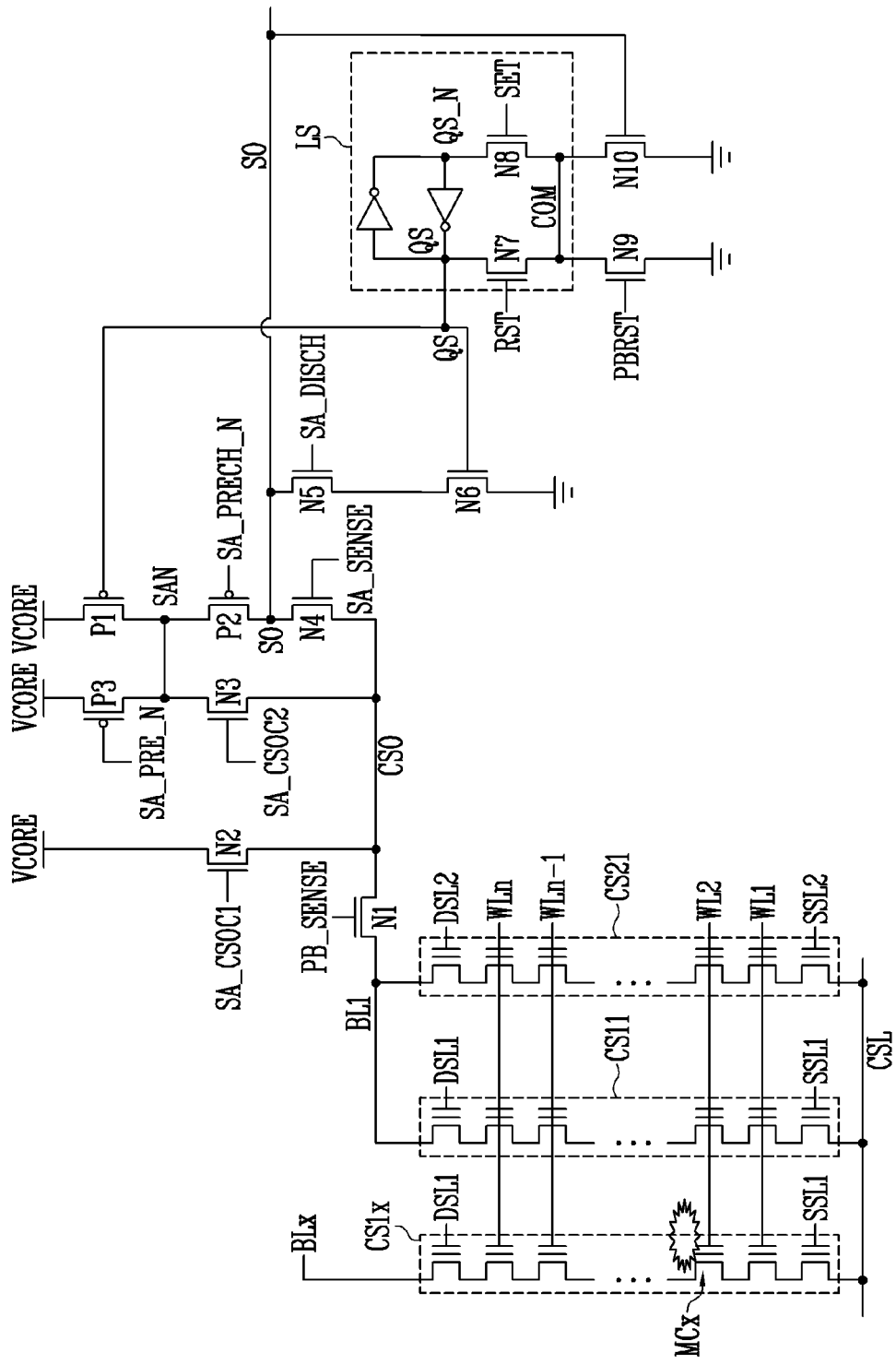
FIG. 5A is a diagram for explaining a situation in which a fault in which some of word lines coupled to a memory cell array are shorted to a channel occurs.

FIG. 5A is a diagram for explaining a situation in which a fault in which some of word lines coupled to a memory cell array are shorted to a channel occurs.

Referring to FIG. 5A, cell strings CS11 and CS21 coupled to a page buffer through a first bit line BL1 and a cell string CS1x coupled to an x-th bit line BLx are illustrated. The x-th bit line BLx may be any one of second to m-th bit lines BL2 to BLm illustrated in FIG. 2. The cell string CS1x is not coupled to the page buffer illustrated in FIG. 5A. Although not illustrated in FIG. 5A, an additional cell string other than the cell string CS1x may be further coupled to the x-th bit line BLx.

In FIG. 5A, a short-circuit fault between a word line and a channel has occurred in the cell string CS1x coupled to the x-th bit line BLx. More specifically, a short-circuit fault between a word line and a channel has occurred in a memory cell MCx coupled to a second word line WL2, among memory cells included in the cell string CS1x. That is, a short circuit has occurred between the second word line WL2 and the channel of the memory cell MCx. In this state, the method of testing the semiconductor memory device according to an embodiment of the present disclosure will be described.

Figure 5B:
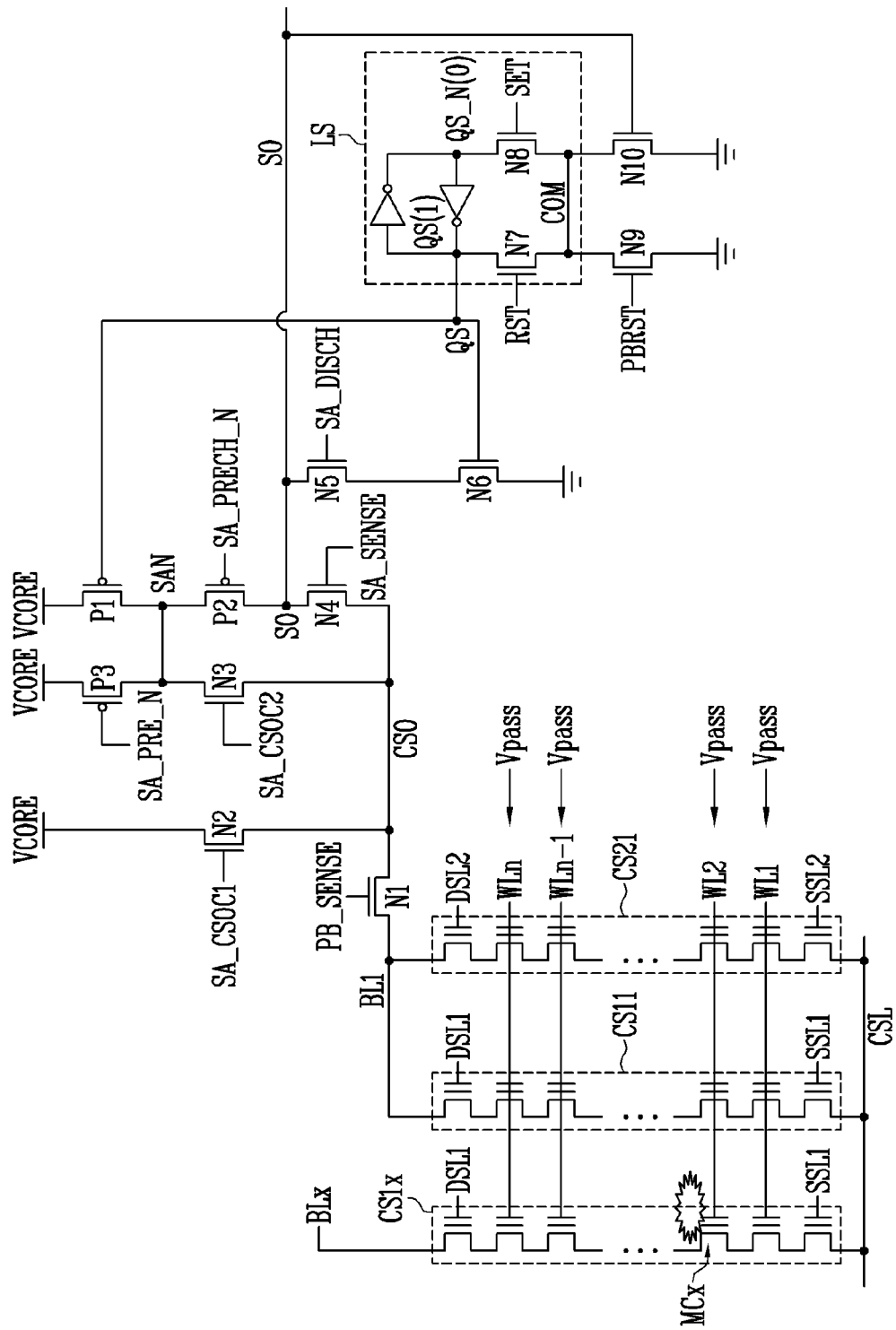
FIG. 5B is a diagram for explaining the operation of the page buffer during a word line precharge period of FIG. 4.

FIG. 5B is a diagram for explaining the operation of the page buffer during the word line precharge period of FIG. 4. Hereinafter, a description will be made with reference to FIGS. 4 and 5B together. Referring to FIG. 5B together with FIG. 4, a word line precharge operation may performed during a period from t1 to t2. In detail, during the period from t1 to t2, a pass voltage Vpass is applied to word lines WL coupled to a memory block that is a test target for fault detection. Therefore, during the period from t1 to t2, the word lines WL may be precharged to the level of the pass voltage Vpass.

The word line precharge operation may be performed by the address decoder 120 illustrated in FIG. 1. The address decoder 120 may apply the pass voltage Vpass received from a voltage generator 150 to the word lines WL under the control of control logic 140.

The pass voltage Vpass of FIG. 4 may be a read pass voltage, and may be a voltage that enables the memory cells to be turned on regardless of the threshold voltages of respective memory cells. Meanwhile, during the period t1 to t2, a turn-on voltage Von may be applied to the selected drain select line Selected DSL and the selected source select line Selected SSL. Accordingly, a selected drain select transistor and a selected source select transistor may be turned on. In FIG. 4, it is assumed that the first drain select line SSL1 and the first source select line SSL1 are individually selected. Meanwhile, during the period from t1 to t2, a ground voltage may be applied to the unselected drain select line Unselected DSL, and the turn-on voltage may be applied to the unselected source select line Unselected SSL.

Further, during the period from t1 to t2, the signals SA_CSOC1 and PB_SENSE may be deactivated to a low level. Accordingly, the first and second NMOS transistors N1 and N2 are turned off. Meanwhile, during the period from t1 to t2, the signals SA_PRECH_N and SA_PRE_N may be deactivated to a high level, for example, the level of a supply voltage VCORE. Accordingly, the second and third PMOS transistors P2 and P3 are turned off. Furthermore, during the period from t1 to t2, the signal SA_SENSE may be deactivated to a low level. Accordingly, the fourth NMOS transistor N4 is turned off.

Meanwhile, the signals PBRST and SET may be toggled during a part of the period from t1 to t2. As the signals PBRST and SET are toggled, the eighth and ninth NMOS transistors N8 and N9 may be turned on for a certain period of time. As the eighth and ninth NMOS transistors N8 and N9 are turned on, the node QS_N of the latch circuit LS is coupled to the ground for a certain period of time. Therefore, during the period from t1 to t2, the voltage of the node QS_N of the latch circuit LS may be at a low level having a logic value of "0", and the voltage of the node QS may be at a high level having a logic value of "1". In this way, during the period from t1 to t2, the value stored in the latch circuit LS is initialized.

Figure 5C:
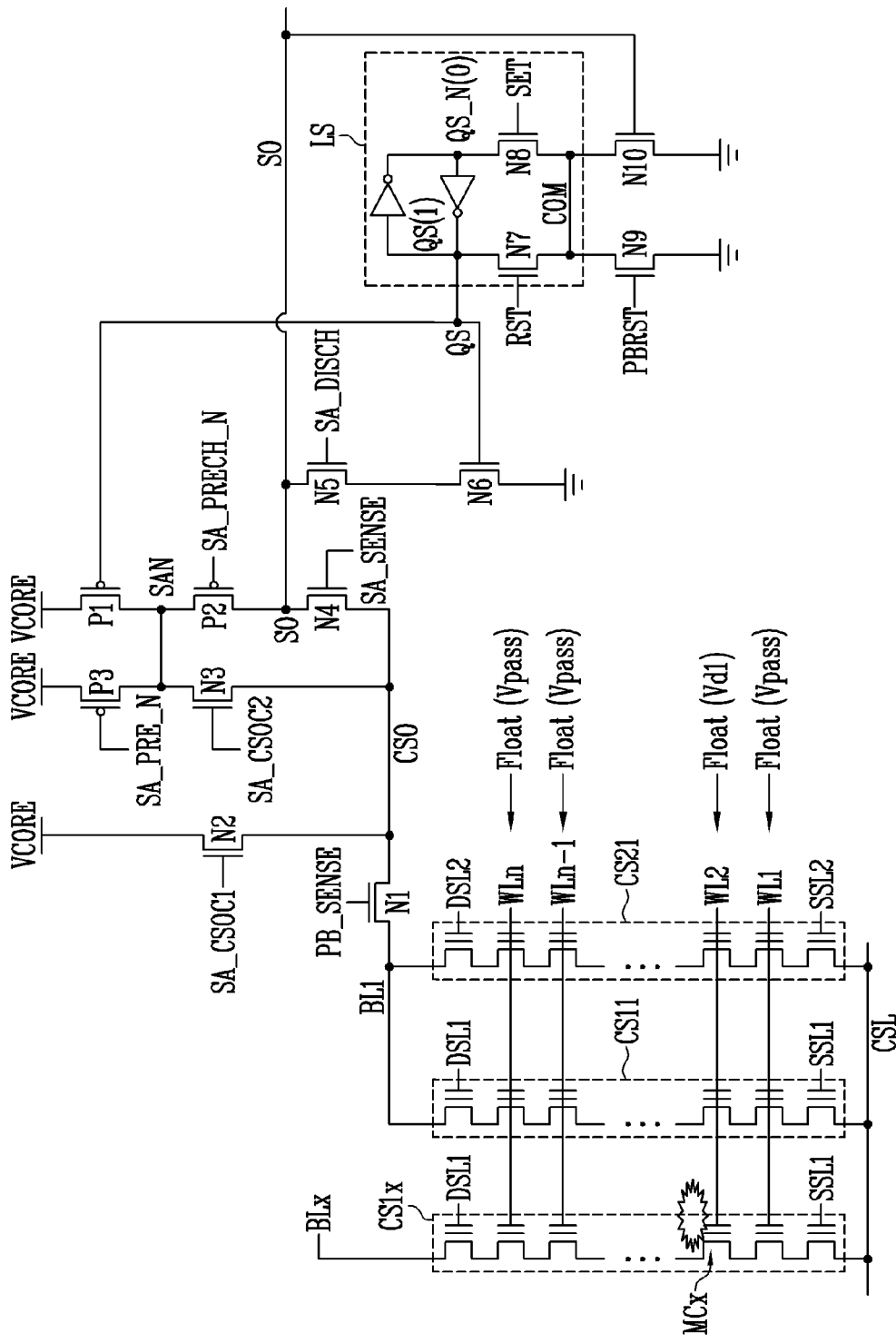
FIG. 5C is a diagram for explaining the operation of the page buffer during a word line stabilization period of FIG. 4.

FIG. 5C is a diagram for explaining the operation of the page buffer during the word line stabilization period of FIG. 4. Hereinafter, a description will be made with reference to FIGS. 4 and 5C together.

Referring to FIG. 5C together with FIG. 4, a word line stabilization operation is performed during a period from t2 to t3. In detail, all of word lines WL coupled to a memory block that is a test target for fault detection may float at time t2. Accordingly, the voltages of typical word lines may be maintained at the level of the pass voltage Vpass, which is a precharge voltage.

The word line stabilization operation may be performed by the address decoder 120 illustrated in FIG. 1. The address decoder 120 may allow the word lines WL coupled to the memory block to float under the control of the control logic 140. Although not illustrated in FIG. 1, the address decoder 120 may allow the word lines WL to float by turning off word line switches directly coupled to the word lines WL. The word line switches may be switches included in the address decoder 120.

However, when a short circuit occurs between a word line and a channel, a leakage current flows in a direction from the corresponding word line to the channel. As illustrated in FIG. 5C, a short circuit occurs between the channel of the memory cell MCx included in the cell string CS1x coupled to the x-th bit line BLx and a second word line WL2, and thus a leakage current flows from the second word line WL2 to the channel area of the memory cell MCx. Accordingly, the voltage of the second word line WL2 decreases from the pass voltage Vpass to a voltage Vd1.

In FIG. 4, during a period from t2 to t7, the voltage level of the word line in which a short circuit to the channel of the memory cell occurs is indicated by a dotted line, and the voltage level of a faultless word line is indicated by a solid line. As illustrated in FIG. 4, the voltage level of the word line in which the short-circuit fault has occurred may decrease to the voltage Vd1. The voltage Vd1 may be a voltage by which the memory cells coupled to the word line in which the short-circuit fault has occurred cannot be turned on.

For this, before the test operation according to the present disclosure is performed, the threshold voltages of memory cells included in the memory block need to be adjusted to be higher than a minimum threshold voltage. Here, the voltage Vd1 may be a voltage lower than the minimum threshold voltage.

The length of the word line stabilization period may be set to be sufficiently long so that, as the short circuit between the word line and the channel occurs, the voltage of the word line, which was initially precharged, may be sufficiently low.

Figure 5D:
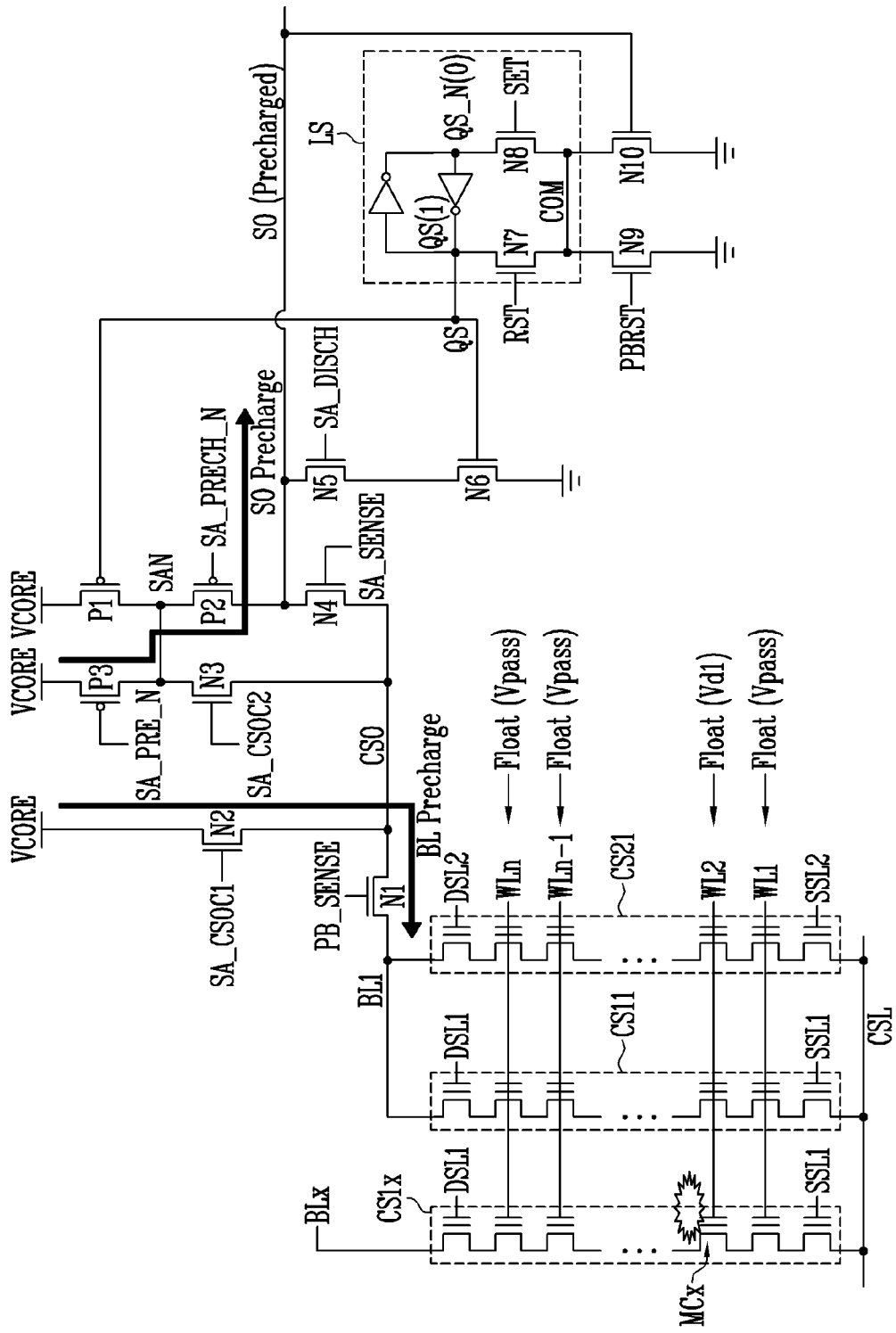
FIG. 5D is a diagram for explaining the operation of the page buffer during a bit line precharge period and a sensing node (SO) precharge period of FIG. 4.

FIG. 5D is a diagram for explaining the operation of the page buffer during the bit line precharge period and the sensing node (SO) precharge period of FIG. 4. Hereinafter, a description will be made with reference to FIGS. 4 and 5D together.

Referring to FIG. 4, during a period from t3 to t4, a bit line precharge operation may be performed, and during a period from t4 to t5, a sensing node (SO) precharge operation may be performed.

First, during the period from t3 to t4, the signals PB_SENSE and SA_CSOC1 may be activated to the levels of a voltage V1 and a voltage V2, respectively. Accordingly, the first and second NMOS transistors N1 and N2 are turned on. In this case, the voltage levels V1 and V2 of the signals PB_SENSE and SA_CSOC1 in an active state may satisfy the following conditions.

V1≥Vt$_{N1}$ (Vt$_{N1}$: threshold voltage of first NMOS transistor N1)
V2≤VCORE+Vt$_{N2}$ (Vt$_{N2}$: threshold voltage of second NMOS transistor N2)
V1≤V2

Based on the above-described conditions, the voltages of the first bit line BL1 and the node CSO may be set. Therefore, the source of the supply voltage VCORE may be coupled to the first bit line BL1, whereby the first bit line BL1 may be precharged. Additionally, the node CSO may also be precharged.

Thereafter, during a period from t4 to t5, signals SA_P-RECH_N and SA_PRE_N may be activated to a low level, for example, the level of a ground voltage. Accordingly, the second and third PMOS transistors P2 and P3 are turned on. Therefore, the node SO may be precharged from the supply voltage VCORE through the second and third PMOS transistors P2 and P3.

Meanwhile, during the period from t4 to t5, the signal SA_SENSE may be activated to the level of the voltage V3. In this case, the voltage level V3 of the signal SA_SENSE in an active state may satisfy the following conditions.

V3≤ VCORE+$Vt_{N4}$ ($Vt_{N4}$: threshold voltage of fourth NMOS transistor N4)
V2≤V3

However, during the period from t4 to t5, the voltage of the node CSO is relatively high, whereby the fourth NMOS transistor N4 may be turned off.

Figure 5E:
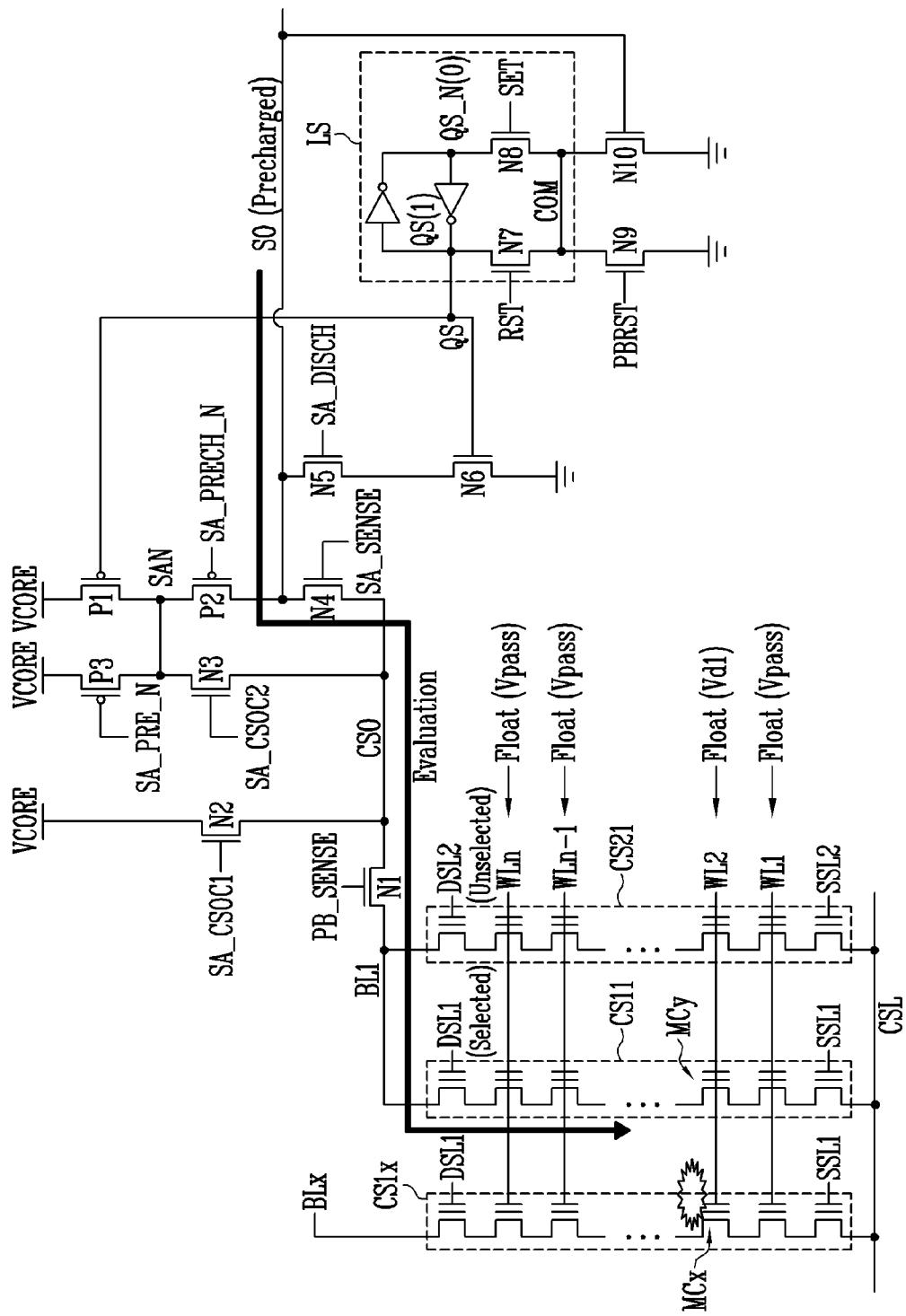
FIG. 5E is a diagram for explaining the operation of the page buffer during an evaluation period of FIG. 4.

FIG. 5E is a diagram for explaining the operation of the page buffer during the evaluation period of FIG. 4. Hereinafter, a description will be made with reference to FIGS. 4 and 5E together.

Referring to FIG. 5E together with FIG. 4, an evaluation operation may be performed during a period from t5 to t6. In detail, during the period from t5 to t6, the signals SA_PRECH_N and SA_PRE_N may be deactivated to a high level. Accordingly, the second and third PMOS transistors P2 and P3 are turned off. Meanwhile, when the evaluation operation is performed, the voltage of the node CSO is relatively lowered. In this case, because the voltage of the node CSO is relatively low and the voltage of the node SO is relatively high, the fourth NMOS transistor N4 is turned on.

As described above, a short circuit occurs between the channel of the memory cell MCx and the second word line WL2, and thus the voltage level of the second word line WL2 is lowered to the voltage Vd1. Accordingly, among memory cells included in a cell string CS11, a memory cell coupled to the second word line WL2 are turned off, and the remaining memory cells are turned on.

Among the memory cells included in the cell string CS11, the memory cell coupled to the second word line WL2 is in a turned-off state, and thus a current path between the node SO and the common source line CSL is blocked. Accordingly, the voltage of the node SO is maintained at a voltage level in a precharge state.

Figure 5F:
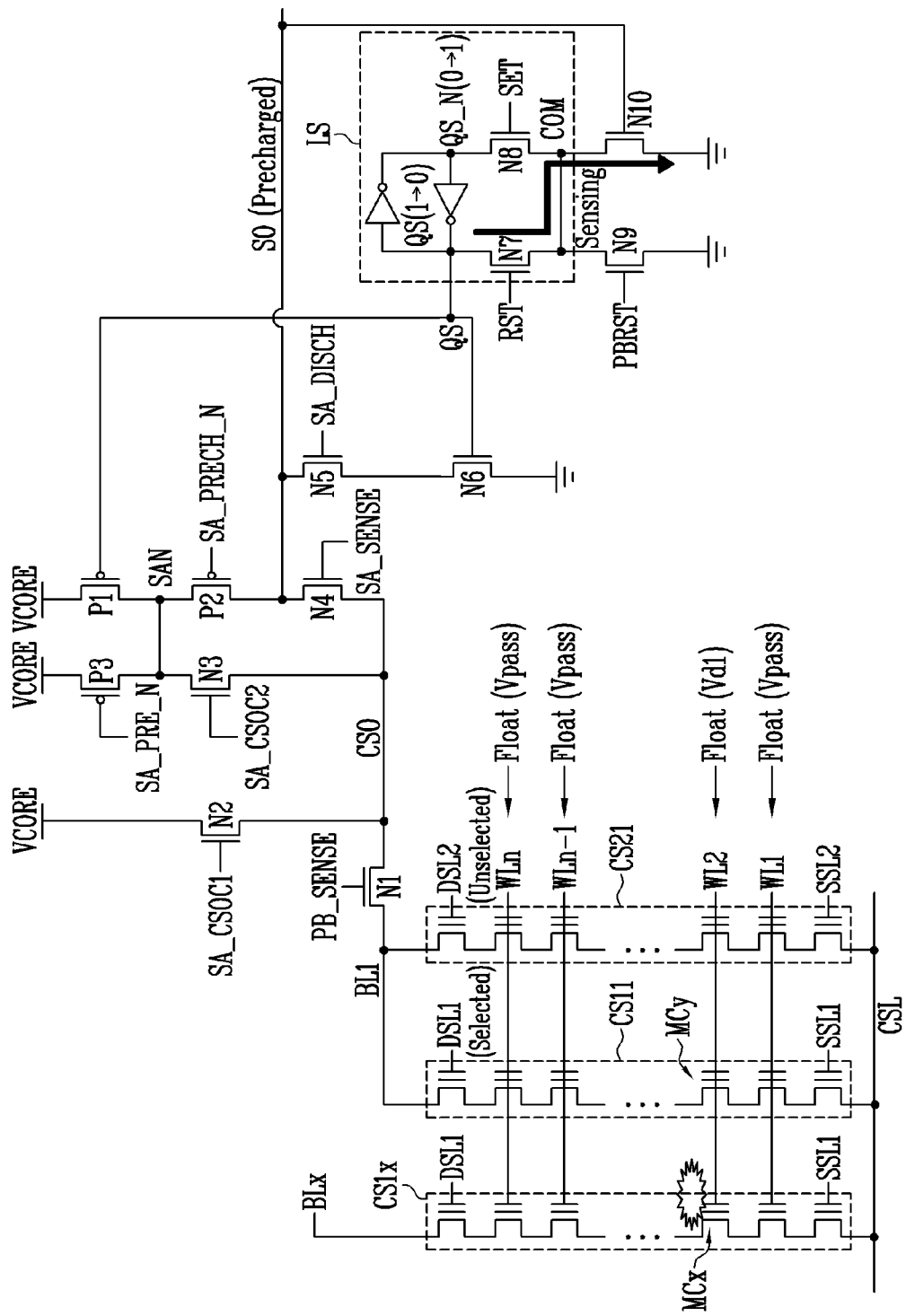
FIG. 5F is a diagram for explaining the operation of the page buffer during a sensing period of FIG. 4.

FIG. 5F is a diagram for explaining the operation of the page buffer during the sensing period of FIG. 4. Hereinafter, a description will be made with reference to FIGS. 4 and 5F together.

Referring to FIG. 5F together with FIG. 4, a sensing operation is performed during a period from t6 to t7. In detail, during the period from t6 to t7, the signal SA_SENSE may be deactivated to a low level. Accordingly, the fourth NMOS transistor N4 may be turned off, and the node SO and the node CSO may be disconnected from each other.

Further, during a part of the period from t6 to t7, the signal RST may be toggled. As the signal RST is toggled, the seventh NMOS transistor N7 may be turned on for a certain period of time. Meanwhile, as described above, the voltage of the node SO is maintained at the precharge level, whereby the tenth NMOS transistor N10 is also in a turned-on state. Accordingly, the node QS of the latch circuit LS is coupled to the ground for a certain period of time. Accordingly, as the signal RST is toggled, the voltage of the node QS of the latch circuit LS may be changed from a high level having a logic value of "1" to a low level having a logic value of "0". Furthermore, the voltage of the node QS_N may be changed from a low level having a logic value of "0" to a high level having a logic value of "1". In this way, during the sensing period, the value stored in the latch circuit LS is changed.

When FIGS. 4 and FIGS. 5A to 5F are summarized, a short-circuit fault has occurred in any one of word lines coupled to the memory block that is the target of operation, and thus the voltage of the word line in which the short circuit has occurred may be decreased during the word line stabilization period. Accordingly, because the current path between the node SO and the common source line CSL is blocked during the evaluation period, the voltage of the node SO is maintained at the precharge level. Therefore, the tenth NMOS transistor N10 is turned on during the sensing period, whereby the value stored in the latch circuit LS is changed.

Assuming that a short-circuit fault does not occur in the word lines coupled to the memory block, the voltages of all word lines may be maintained at the precharge level during a word line stabilization period. Accordingly, during the evaluation period, the current path between the node SO and the common source line CSL may be formed, and thus the voltage of the node SO may be decreased from the precharge level. Therefore, the tenth NMOS transistor N10 is turned off during the sensing period, whereby the value stored in the latch circuit LS may be maintained.

When this process is summarized, the value stored in the latch circuit may be changed by the test operation according to an embodiment of the present disclosure in the case where a short-circuit fault occurs in at least one of word lines coupled to the memory block, and may be maintained in the case where no short-circuit fault occurs on the word lines. In this way, whether a short-circuit fault has occurred in word lines coupled to the memory block may be determined.

Additionally, during the period from t7 to t8 illustrated in FIG. 4, an equalizing operation on word lines may be performed by applying the pass voltage Vpass to all word lines. Here, the signals SA_CSOC1 and PB_SENSE may be deactivated to a low level.

Thereafter, during the period from t8 to t9, a word line discharge operation may be performed. Accordingly, the voltages of the word lines WL may be decreased. Selectively, the signals SA_PRECH_N and SA_PRE_N may be activated to a low level.

Thereafter, during the period from t9 to t10, a select transistor discharge operation may be performed. That is, during the period from t9 to t10, the voltages of a selected drain select line Selected DSL, a selected source select line Selected SSL, and an unselected source select line Unselected SSL may be decreased.

Figure 6:
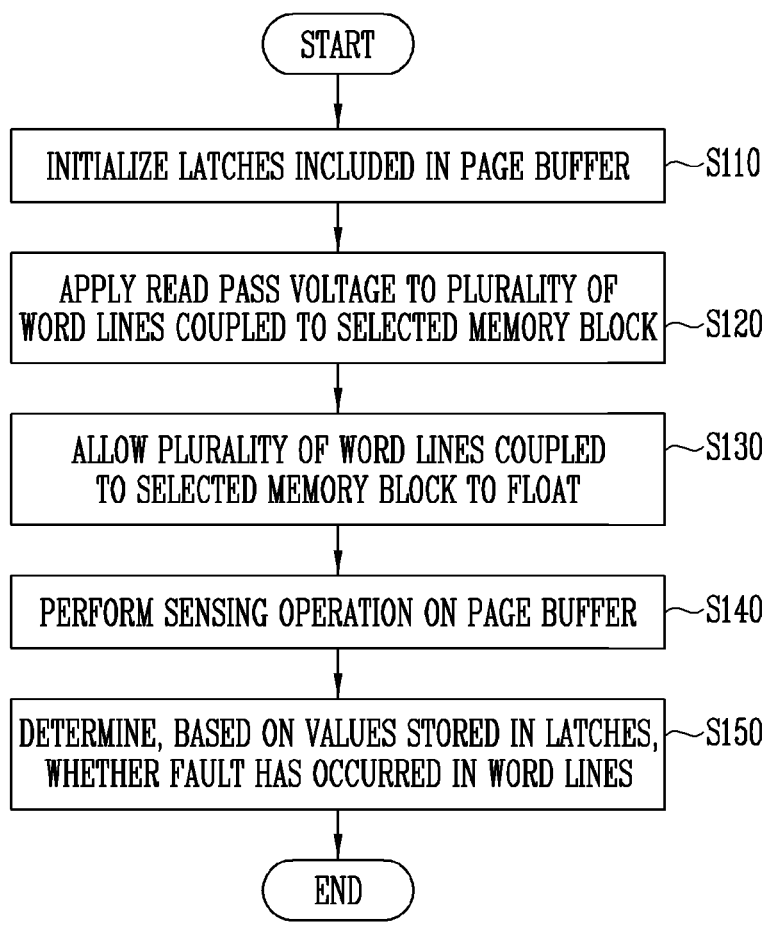
FIG. 6 is a flowchart illustrating a method of testing a semiconductor memory device according to an embodiment of the present disclosure.

FIG. 6 is a flowchart illustrating a method of testing a semiconductor memory device according to an embodiment of the present disclosure.

Referring to FIG. 6, the method of testing the semiconductor memory device according to an embodiment of the present disclosure may include initializing latches included in a page buffer at step S110, applying a read pass voltage to a plurality of word lines coupled to a selected memory block at step S120, allowing the plurality of word lines coupled to the selected memory block to float at step S130, performing a sensing operation on the page buffer at step S140, and determining, based on values stored in the latches included in the page buffer, whether a fault has occurred in word lines at step S150.

At step S110, the value stored in a latch circuit included in the page buffer may be initialized. As described above with reference to FIGS. 4 and 5B, signals PBRST and SET may be toggled during a part of the period from t1 to t2, and thus the voltage of the node QS of the latch circuit LS may be initialized to a high level indicating "1", and the voltage of the node QS_N may be initialized to a low level indicating "0".

At step S120, all of the word lines may be precharged to the read pass voltage. As described above with reference to FIGS. 4 and 5B, word lines WL may be precharged by applying the pass voltage Vpass to the word lines WL during the period from t1 to t2.

In FIG. 6, although step S120 is illustrated as being performed after step S110 is performed, the present disclosure is not limited thereto. That is, step S110 may be performed after step S120 is performed, or steps S110 and S120 may be simultaneously performed.

At step S130, a plurality of word lines coupled to the selected memory block may float. As described above with reference to FIGS. 4 and 5C, the word lines WL may float during a word line stabilization period. As operation at step S130 is performed, the voltage of a word line in which a short-circuit fault does not occur is maintained at a precharge level, but the voltage of a word line in which a short-circuit fault has occurred may be decreased to a voltage Vd1.

At step S140, the sensing operation on the page buffer may be performed. More specifically, as described above with reference to FIGS. 4 and 5C, a bit line precharge operation and a sensing node (SO) precharge operation are performed, as described above with reference to FIGS. 4 and 5D, an evaluation operation is performed, and as described above with reference to FIG. 5E, a sensing operation is performed. As a result of performing step S140, a value indicating whether a short-circuit fault has occurred in word lines may be stored in the latch circuit. In detail, when a short-circuit fault occurs in word lines, a value changed from an initialized value may be stored in the latch circuit. On the other hand, when a short-circuit fault does not occur in word lines, the initialized value stored in the latch circuit may be maintained.

At step S150, whether a fault has occurred in word lines is determined based on the values stored in the latches. When the value stored in the latch circuit is changed from the initialized value, it may be determined that a short-circuit fault has occurred in at least one of the word lines WL. On the other hand, when the value stored in the latch circuit is maintained at the initialized value, it may be determined that no short-circuit fault has occurred in the word lines WL.

Figure 7:
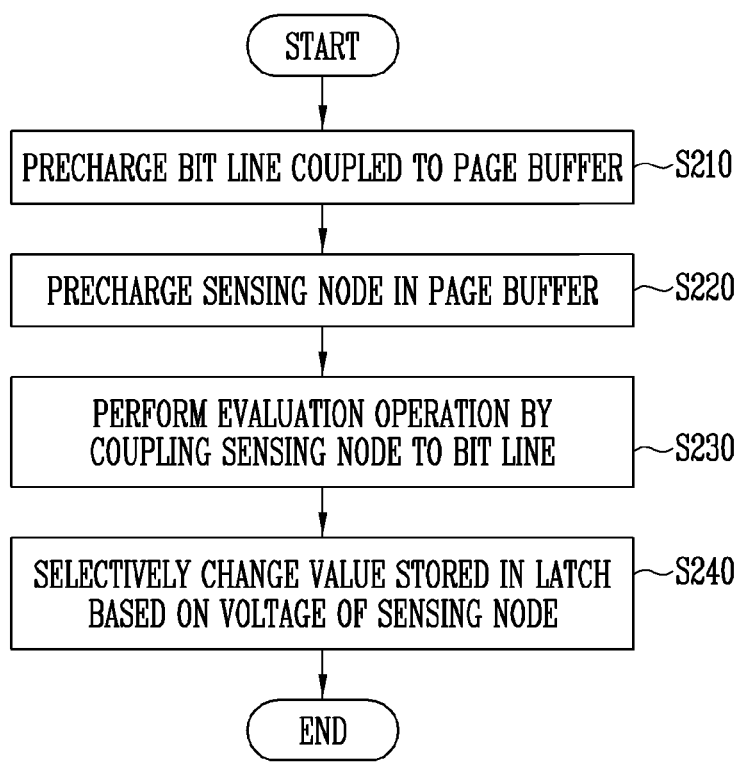
FIG. 7 is a flowchart illustrating an embodiment of step S140 of FIG. 6.

FIG. 7 is a flowchart illustrating an embodiment of step S140 of FIG. 6.

Referring to FIG. 7, step S140 of FIG. 6 may include precharging a bit line coupled to the page buffer at step S210, precharging the voltage of a sensing node in a page buffer at step S220, performing an evaluation operation by coupling the sensing node to the bit line at step S230, and selectively changing a value stored in a latch based on the voltage of the sensing node at step S240.

At step S210, the bit line coupled to the page buffer may be precharged. As described above with reference to FIGS. 4 and 5D, the bit line BL1 may be precharged by turning on the first and second NMOS transistors N1 and N2.

At step S220, the sensing node in the page buffer may be precharged. The sensing node illustrated in FIG. 7 may be a node having a sensing voltage used to change the value stored in the latch. In an example, the sensing node illustrated in FIG. 7 may correspond to the node SO illustrated in FIGS. 3 and 5A to 5F. The node SO may be coupled to the gate of the tenth NMOS transistor N10 coupled to the latch circuit LS, and the value stored in the latch circuit LS may be selectively changed depending on the voltage level of the node SO.

As described above with reference to FIGS. 4 and 5D, the node SO may be precharged by turning on the second and third PMOS transistors P2 and P3. Meanwhile, the node SO may be precharged by turning on the second and fourth NMOS transistors N2 and N4.

At step S230, the evaluation operation may be performed by coupling the sensing node to the bit line. The sensing node may correspond to the node SO illustrated in FIGS. 3 and 5A to 5F. As described above with reference to FIGS. 4 and 5E, the evaluation operation may be performed by coupling the first bit line BL1 to the node SO. When a short-circuit fault occurs in at least one of word lines, at least one of memory cells included in the cell string CS11 is turned off, whereby the voltage of the node SO may be maintained at a precharge level. On the other hand, when no short-circuit fault occurs in the word lines, all memory cells included in the cell string CS11 are turned on, whereby the voltage of the node SO may be decreased.

At step S240, the value stored in the latch may be selectively changed based on the voltage of the sensing node. As described above with reference to FIGS. 4 and 5F, the seventh NMOS transistor N7 may be toggled, whereby the node QS of the latch circuit LS may be coupled to the node COM. When the voltage of the node SO is maintained at the precharged level, the tenth NMOS transistor N10 remains turned on, and thus the voltage of the node QS is changed to a low level indicating "0". On the other hand, when the voltage of the node SO is decreased, the tenth NMOS transistor N10 remains turned off, and thus the voltage of the node QS is maintained at a high level indicating "1".

Figure 8:
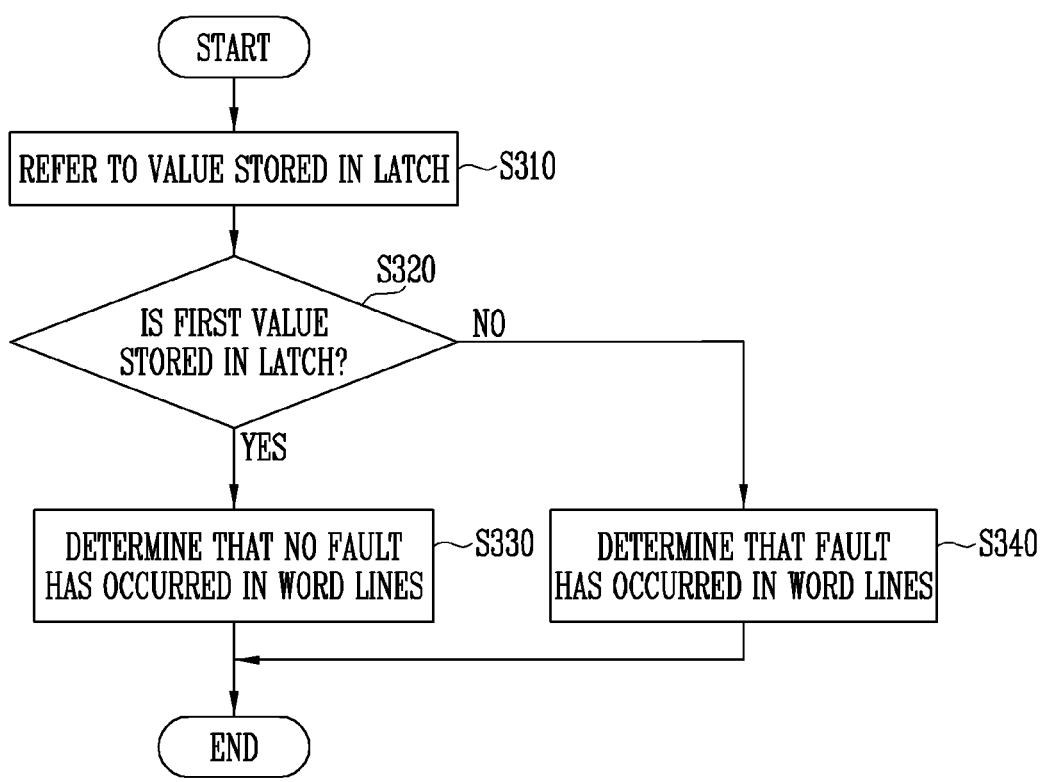
FIG. 8 is a flowchart illustrating an embodiment of step S150 of FIG. 6.

FIG. 8 is a flowchart illustrating an embodiment of step S150 of FIG. 6.

Referring to FIG. 8, step S150 of FIG. 6 may include referring to a value stored in a latch at step S310, determining whether a first value is stored in the latch at step S320, when it is determined that the first value is stored in the latch (in the case of Yes at step S320), determining that no fault has occurred in word lines at step S330, and when it is determined that a second value other than the first value is stored (in the case of No at step S320), it may be determined that a fault has occurred in word lines at step S340.

At step S310, the value stored in the latch may be referred to using a scheme for checking the voltage level of the node QS of the latch circuit LS in the page buffer. Thereafter, whether the first value is stored in the latch may be determined at step S320. In FIG. 8, the first value may be the value initially stored in the latch.

The case where the first value is stored in the latch (in the case of Yes at step S320) may mean that the initial value of the latch has been maintained. Therefore, in this case, it may be determined that no short-circuit fault has occurred in word lines at step S330. On the other hand, the case where the second value other than the first value is stored in the latch (in the case of No at step S320) may mean that the initial value of the latch has been changed. Therefore, in this case, it may be determined that a short-circuit fault has occurred in word lines at step S340.

In accordance with the embodiments illustrated in FIGS. 4 and 6, it is possible only to determine whether a short-circuit fault associated with at least one of all word lines is present, but it is impossible to identify the corresponding word line in which the short-circuit fault has occurred. In accordance with an additional embodiment of the present disclosure, whether a short-circuit fault has occurred in some specific word lines may be selectively determined by allowing some word lines to float, instead of allowing all word lines to float. Hereinafter, the additional embodiment of the present disclosure will be described in detail with reference to FIGS. 9 and 10.

Figure 9:
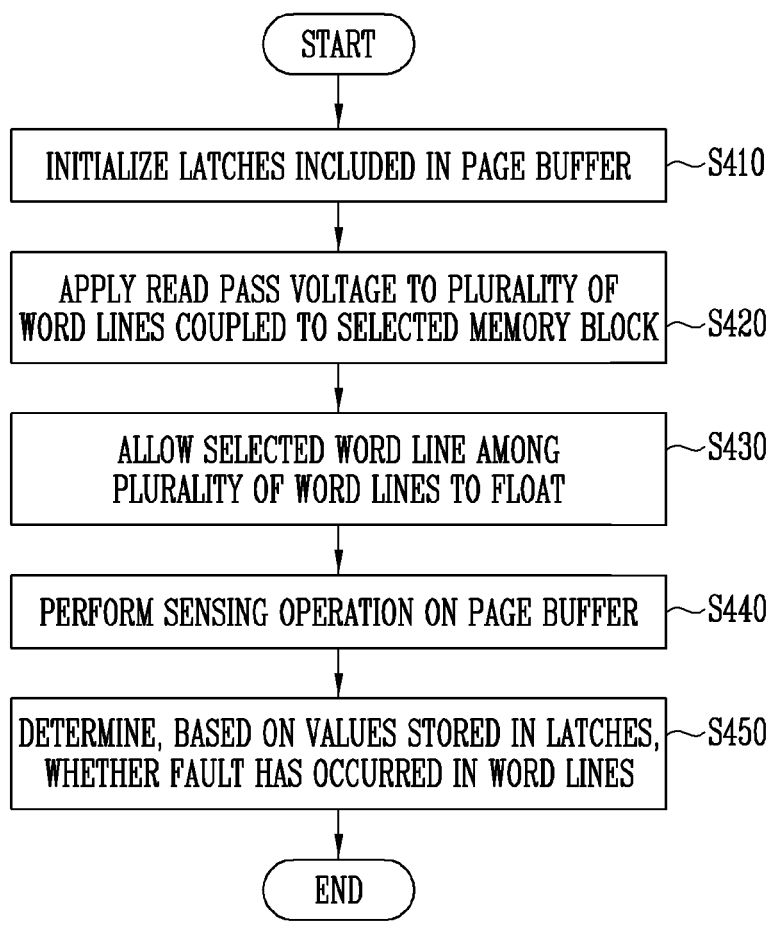
FIG. 9 is a flowchart illustrating a method of testing a semiconductor memory device according to an embodiment of the present disclosure.

FIG. 9 is a flowchart illustrating a method of testing a semiconductor memory device according to an embodiment of the present disclosure.

Referring to FIG. 9, a method of testing a semiconductor memory device according to an embodiment of the present disclosure may include initializing latches included in a page buffer at step S410, applying a read pass voltage to a plurality of word lines coupled to a selected memory block at step S420, allowing a selected word line among the plurality of word lines to float at step S430, performing a sensing operation on the page buffer at step S440, and determining, based on values stored in latches included in the page buffer, whether a fault has occurred in word lines at step S450.

Referring to FIGS. 6 and 9, step S130 of FIG. 6 may allow the plurality of word lines to float, whereas step S430 of FIG. 9 may allow the selected word line among the plurality of word lines to float. Therefore, in accordance with the embodiment illustrated in FIG. 9, the read pass voltage may be continuously applied to unselected word lines. A description will be made with reference to FIG. 10 together with FIG. 9.

Figure 10:
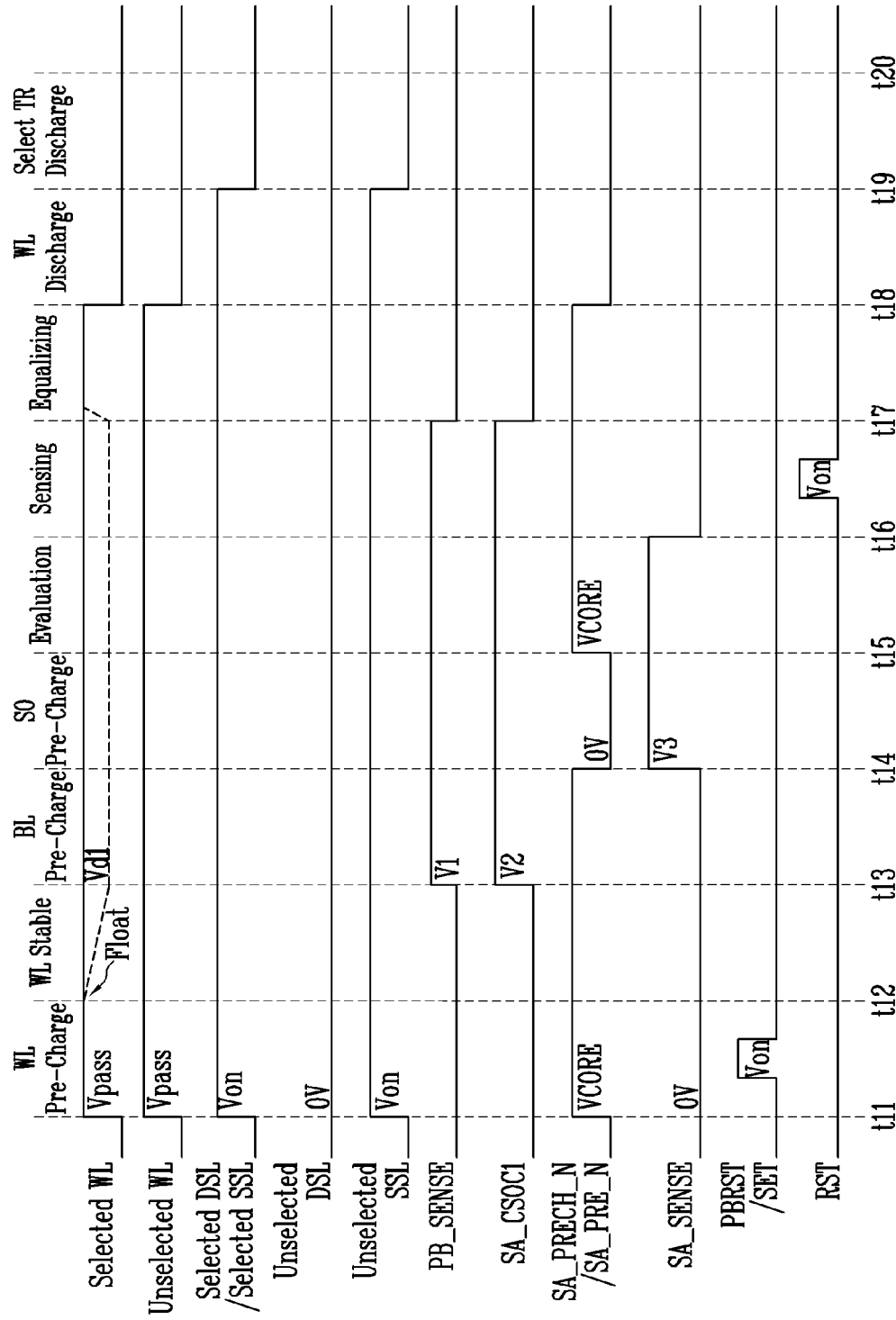
FIG. 10 is a timing diagram for explaining the test method of FIG. 9.

FIG. 10 is a timing diagram for explaining the test method of FIG. 9.

Referring to FIG. 10, in accordance with the method of testing the semiconductor memory device according to the additional embodiment of the present disclosure, a plurality of word lines coupled to the memory block may be precharged, and thereafter a selected word line, among the precharged word lines, may float. Thereafter, whether a short-circuit fault has occurred in the selected word line may be determined through an evaluation and sensing process after undergoing a bit line precharge and sensing node (SO) precharge operation.

More specifically, referring to FIG. 10, a word line precharge operation may be performed during a period from t11 to t12, a word line stabilization operation may be performed during a period from t12 to t13, a bit line precharge operation may be performed during a period from t13 to t14, a sensing node (SO) precharge operation may be performed during a period from t14 to t15, an evaluation operation may be performed during a period from t15 to t16, and a sensing operation may be performed during a period from t16 to t17.

During the period from t11 to t12, the word line precharge operation may be performed. In detail, during the period from t11 to t12, a pass voltage Vpass may be applied to the selected word line and unselected word lines, among the plurality of word lines. Therefore, during the period from t11 to t12, the word lines WL may be precharged to the level of the pass voltage Vpass.

During the period from t12 to t13, the word line stabilization operation may be performed. In detail, at time t12, the selected word line, among the plurality of word lines, may float. Meanwhile, the pass voltage may be continuously applied to the unselected word lines.

However, when a short circuit occurs between the selected word line and a channel, a leakage current may flow in a direction from the selected word line to the channel. In FIG. 10, during a period from t12 to t17, the voltage level of the selected word line appearing when a short circuit occurs in the selected word line is indicated by a dotted line. On the other hand, the voltage level of the selected word line appearing when a short circuit does not occur in the selected word line is indicated by a solid line. As illustrated in FIG. 10, the voltage level of the word line in which the short-circuit fault has occurred may decrease to a voltage Vd1. The voltage Vd1 may be a voltage by which the memory cells coupled to the word line in which the short-circuit fault has occurred cannot be turned on.

Comparing FIGS. 4 and 10 with each other, there is a difference in that the embodiment of FIG. 4 is configured such that, during the word line stabilization period, all word lines are floating, whereas the embodiment of FIG. 10 is configured such that only the selected word line is floating and the pass voltage is continuously applied to unselected word lines. Because other details in the embodiments of FIGS. 4 and 10 are substantially identical to each other, repeated descriptions thereof will be omitted.

As described above, in accordance with the method of testing the semiconductor memory device according to the additional embodiment of the present disclosure, a plurality of word lines coupled to the memory block may be precharged, and thereafter a selected word line, among the precharged word lines, may float. Thereafter, whether a short-circuit fault has occurred in the selected word line may be determined through an evaluation and sensing process after undergoing a bit line precharge and sensing node (SO) precharge operation.

In accordance with the embodiments illustrated in FIGS. 4 and 10, the method of detecting short-circuit faults occurring in word lines has been explained. However, short-circuit faults may occur not only in word lines but also in select lines. In accordance with an embodiment of the present disclosure, whether a short-circuit fault is present in some select lines may be selectively determined by allowing some select lines to float, instead of allowing word lines to float. Hereinafter, an additional embodiment of the present disclosure will be described in detail with reference to FIGS. 11 and 12.

Figure 11:
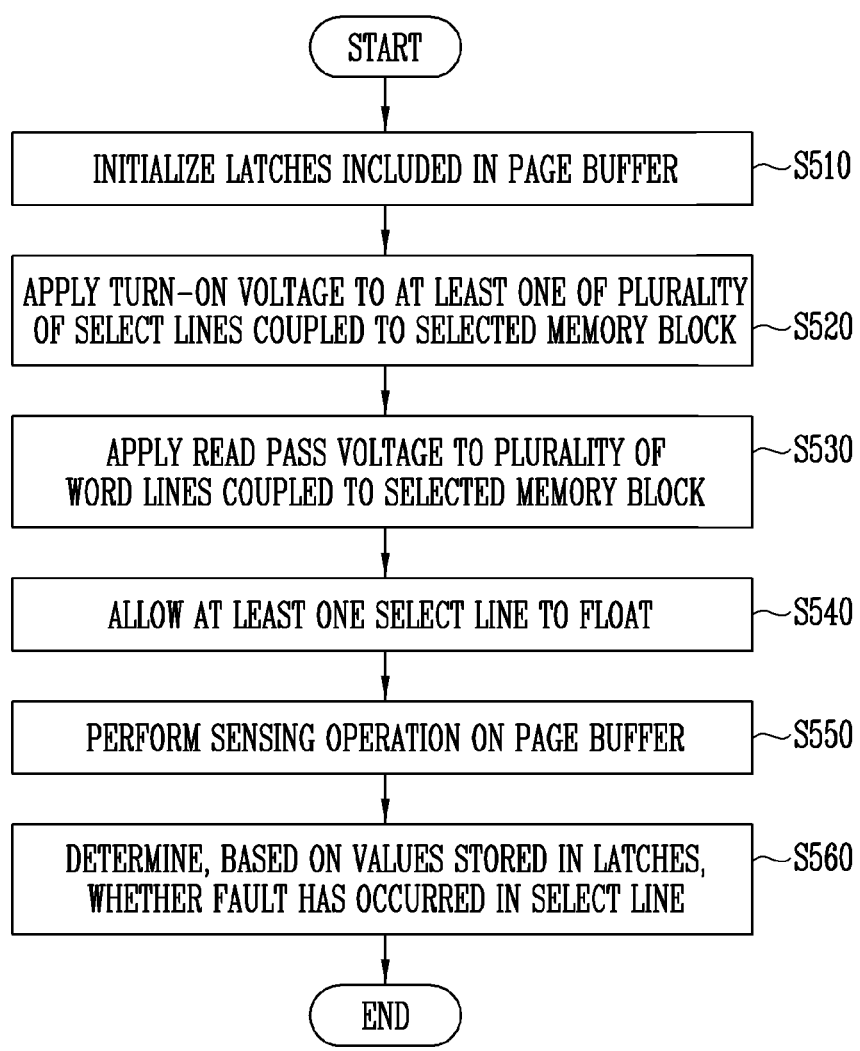
FIG. 11 is a flowchart illustrating a method of testing a semiconductor memory device according to an embodiment of the present disclosure.

FIG. 11 is a flowchart illustrating a method of testing a semiconductor memory device according to an embodiment of the present disclosure.

Referring to FIG. 11, the method of testing the semiconductor memory device according to the embodiment of the present disclosure may include initializing latches included in a page buffer at step S510, applying a turn-on voltage to at least one of a plurality of select lines coupled to a selected memory block at step S520, applying a read pass voltage to a plurality of word lines coupled to the selected memory block at step S530, allowing at least one select line to float at step S540, performing a sensing operation on the page buffer at step S550, and determining, based on values stored in latches included in the page buffer, whether a fault has occurred in the select line at step S560.

In the embodiment illustrated in FIG. 11, the select line may be a line for controlling select transistors which selectively couple the corresponding cell string to a bit line or a common source line. In an example, the select line may include at least some of drain select lines DSL1 and DSL2 and source select lines SSL1 and SSL2.

Comparing the embodiment of FIGS. 6 and 9 with the embodiment of FIG. 11, the embodiment of FIGS. 6 and 9 is configured to allow all or some of a plurality of word lines to float, whereas the embodiment of FIG. 11 allows the select line or select lines instead of the word lines to float. Therefore, in accordance with the embodiment illustrated in FIG. 11, the read pass voltage may be continuously applied to the word lines. Hereinafter, a description will be made with reference to FIG. 12 together with FIG. 11.

Figure 12:
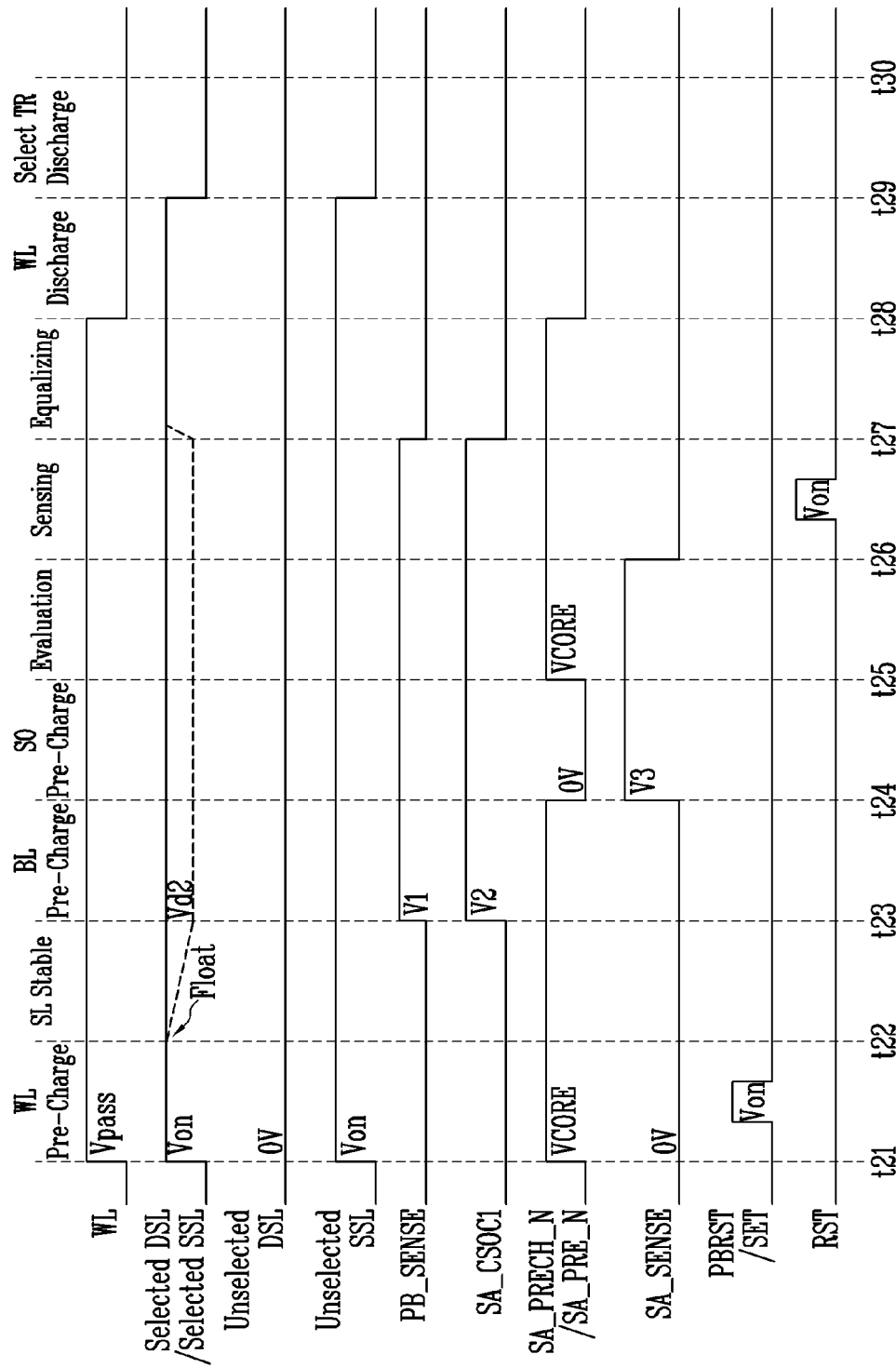
FIG. 12 is a timing diagram for explaining the test method of FIG. 11.

FIG. 12 is a timing diagram for explaining the test method of FIG. 11.

Referring to FIG. 12, in accordance with the method of testing the semiconductor memory device according to an embodiment of the present disclosure, select lines coupled to a memory block may be precharged, and thereafter at least one of the precharged select lines may float. In the embodiment of FIG. 12, a selected drain select line Selected DSL and a selected source select line Selected SSL are illustrated as floating.

More specifically, referring to FIG. 12, a word line precharge operation may be performed during a period from t21 to t22, a select line stabilization operation may be performed during a period from t22 to t23, a bit line precharge operation may be performed during a period from t23 to t24, a sensing node (SO) precharge operation may be performed during a period from t24 to t25, an evaluation operation may be performed during a period from t25 to t26, and a sensing operation may be performed during a period from t26 to t27.

During the period from t21 to t22, the word line precharge operation may be performed. In detail, during the period from t21 to t22, a pass voltage Vpass may be applied to the selected word line and unselected word lines, among the plurality of word lines. Therefore, during the period from t21 to t22, the word lines WL may be precharged to the level of the pass voltage Vpass.

Meanwhile, during the period from t21 to t22, a select line precharge operation may be performed together with the word line precharge operation. In detail, during the period t21 to t22, the selected drain select line Selected DSL and the selected source select line Selected SSL may be precharged to a turn-on voltage Von.

During the period from t22 to t23, the select line stabilization operation may be performed. In detail, the selected drain select line Selected DSL and the selected source select line Selected SSL may float at time t22. Meanwhile, the pass voltage may be continuously applied to the word lines.

The select line stabilization operation may be performed by the address decoder 120 illustrated in FIG. 1. The address decoder 120 may allow the select lines coupled to the memory block to float under the control of the control logic 140. Although not illustrated in FIG. 1, the address decoder 120 may allow the select lines to float by turning off select line switches directly coupled to the select lines. The select line switches may be switches included in the address decoder 120.

However, when a short circuit occurs between a select line and a channel, a leakage current may flow in a direction from the select line to the channel. In FIG. 12, during a period from t22 to t27, the voltage level of the select line appearing when a short circuit occurs in the select line is indicated by a dotted line. On the other hand, the voltage level of the select line appearing when a short circuit does not occur in the select line is indicated by a solid line. As illustrated in FIG. 12, the voltage level of the select line in which the short-circuit fault has occurred may decrease to a voltage Vd2. The voltage Vd2 may be a voltage by which the memory cells coupled to the select line in which the short-circuit fault has occurred cannot be turned on.

Comparing the embodiment of FIGS. 4 and 10 with the embodiment of FIG. 12, the embodiment of FIGS. 4 and 10 is configured to allow all or some of word lines to float during the word line stabilization period, whereas the embodiment of FIG. 12 is configured to allow at least one select line to float and continuously apply a pass voltage to word lines during the select line stabilization period. Because other details in the embodiment of FIGS. 4 and 10 and the embodiment of FIG. 12 are substantially identical to each other, repeated descriptions thereof will be omitted.

In accordance with the method of testing the semiconductor memory device according to the additional embodiment of the present disclosure, whether a short-circuit fault is present in some select lines may be selectively determined by allowing some select lines to float instead of allowing word lines to float.

An embodiment of the present disclosure may provide a semiconductor memory device that is capable of detecting short-circuit faults occurring in a word line or a select line, and a method of testing the semiconductor memory device.

What is claimed is:

1. A method of operating a semiconductor device, comprising:
   initializing a latch included in a page buffer;
   applying a read pass voltage to a plurality of word lines;
   allowing at least one of the plurality of word lines to float;
   performing a sensing operation on the page buffer; and
   determining, based on a value stored in the latch, whether a fault has occurred in the at least one of the plurality of word lines.

2. The method according to claim 1, wherein performing the sensing operation on the page buffer comprises:
   precharging a bit line coupled to the page buffer;
   precharging a sensing node in the page buffer;
   performing an evaluation operation by coupling the sensing node to the bit line; and
   selectively changing a value stored in the latch based on a voltage of the sensing node.

3. The method according to claim 1, wherein allowing the at least one of the plurality of word lines to float comprises:
   allowing all of the plurality of word lines to float.

4. The method according to claim 1, wherein allowing the at least one of the plurality of word lines to float comprises:
   allowing any one of the plurality of word lines to float.

5. The method according to claim 1, wherein when only one of the plurality of word lines is floated, then any one of the plurality of word lines is allowed to float.

6. The method according to claim 1, wherein determining whether the fault has occurred in the at least one of the plurality of word lines comprises:
   referring to the value stored in the latch; and
   determining that no fault has occurred in the at least one word line in response to a determination that the value stored in the latch is a first value stored in the latch in initializing the latch.

7. The method according to claim 1, wherein determining whether the fault has occurred in the at least one of the plurality of word lines comprises:
   referring to the value stored in the latch; and
   determining that a fault has occurred in the at least one word line in response to a determination that the value stored in the latch is not a first value stored in the latch in initializing the latch.

8. A method of operating a semiconductor device, comprising:
   initializing a latch included in a page buffer;
   applying a turn-on voltage to at least one of a plurality of select lines coupled to a memory block;
   applying a read pass voltage to a plurality of word lines;
   allowing the at least one of the plurality of select lines to float;

performing a sensing operation on the page buffer; and determining, based on a value stored in the latch, whether a fault has occurred in the at least one of the plurality of word lines and the at least one of the plurality of select lines.

9. A semiconductor device, comprising:

a memory cell array including a plurality of memory cells;

a page buffer coupled to the memory cell array through a bit line;

an address decoder coupled to the memory cell array through select lines and word lines; and control logic configured to control operations of the page buffer and the address decoder, wherein the control logic is configured to control the page buffer and the address decoder to initialize a latch included in the page buffer, apply a read pass voltage to the word lines, allow at least one of the word lines and the select lines to float, perform a sensing operation on the page buffer, and determine, based on a value stored in the latch, whether a fault has occurred in at least one of the word lines and the select lines.

10. The semiconductor device according to claim 9, wherein, during the sensing operation on the page buffer, the control logic is configured to control the page buffer to precharge the bit line, precharge a sensing node in the page buffer, perform an evaluation operation by coupling the sensing node to the bit line, and selectively change a value stored in the latch based on a voltage of the sensing node.

11. The semiconductor device according to claim 9, wherein the control logic is configured to control the address decoder to allow all of the word lines to float after applying the read pass voltage to the word lines.

12. The semiconductor device according to claim 9, wherein the control logic is configured to control the address decoder to allow at least one of the word lines to float after applying the read pass voltage to the word lines.

13. The semiconductor device according to claim 9, wherein when the control logic controls the address decoder to allow only one of the word lines to be floated after applying the read pass voltage to the word lines then the only one word line is any one of the word lines.

14. The semiconductor device according to claim 9, wherein the control logic is configured to control the address decoder to apply a turn-on voltage to at least some of the select lines and thereafter allow at least the some of the select lines to float.

* * * * *